United States Patent
Olsson et al.

(10) Patent No.: US 7,332,901 B2
(45) Date of Patent: Feb. 19, 2008

(54) LOCATOR WITH APPARENT DEPTH INDICATION

(75) Inventors: Mark S. Olsson, La Jolla, CA (US); Michael J. Martin, La Mesa, CA (US); Christoph H. Maier, San Diego, CA (US); Paul G. Stuart, San Diego, CA (US)

(73) Assignee: SeekTech, Inc., San Diego, CA (US)

( * ) Notice: Subject to any disclaimer, the term of this patent is extended or adjusted under 35 U.S.C. 154(b) by 352 days.

(21) Appl. No.: 11/106,894

(22) Filed: Apr. 15, 2005

(65) Prior Publication Data

US 2006/0232259 A1 Oct. 19, 2006

(51) Int. Cl.
*G01V 3/08* (2006.01)
*G01V 3/12* (2006.01)

(52) U.S. Cl. .................... 324/67; 324/326; 324/260

(58) Field of Classification Search ............ 324/66–67, 324/242–244, 260–261, 326, 329–332, 334, 324/344–345, 347–348
See application file for complete search history.

(56) References Cited

U.S. PATENT DOCUMENTS

| | | | | |
|---|---|---|---|---|
| 3,617,865 A | * | 11/1971 | Hakata | ..................... 324/326 |
| 6,437,573 B1 | * | 8/2002 | Golder et al. | ............... 324/329 |
| 6,633,163 B2 | * | 10/2003 | Fling | .......................... 324/326 |
| 7,009,399 B2 | * | 3/2006 | Olsson et al. | ............... 324/326 |

* cited by examiner

*Primary Examiner*—Bot LeDynh
(74) *Attorney, Agent, or Firm*—Michael H. Jester

(57) ABSTRACT

A human-portable utility locator system for locating and tracing a buried utility line characterized by an electromagnetic field emission. The locator may include a horizontal spaced sensor pair for detecting the horizontal field asymmetry of the emitted field in one or more independent frequency bands, which is employed to assist in determining an accurate "virtual depth" measurement for producing detection events. An event detector may be disposed to detect events corresponding to extremum in the B-field gradient with respect to time and a user interface (UI) coupled to the event detector signals the detected event to a user. In a preferred embodiment, one pair of spaced-apart 3D magnetic sensor arrays is disposed substantially orthogonal to another intermediate spaced-apart pair of sensors.

29 Claims, 12 Drawing Sheets

$$G = \begin{pmatrix} G_{xx} & G_{xy} & G_{xz} \\ G_{yx} & G_{yy} & G_{yz} \\ G_{zx} & G_{zy} & G_{zz} \end{pmatrix}$$

$$B = \begin{pmatrix} B_x & B_y & B_z \end{pmatrix}$$

$$B_{G\hat{x}} = \frac{|B_{G_1}| - |B_{G_2}|}{|B_{G_1}| + |B_{G_2}|} = G_{xx}$$

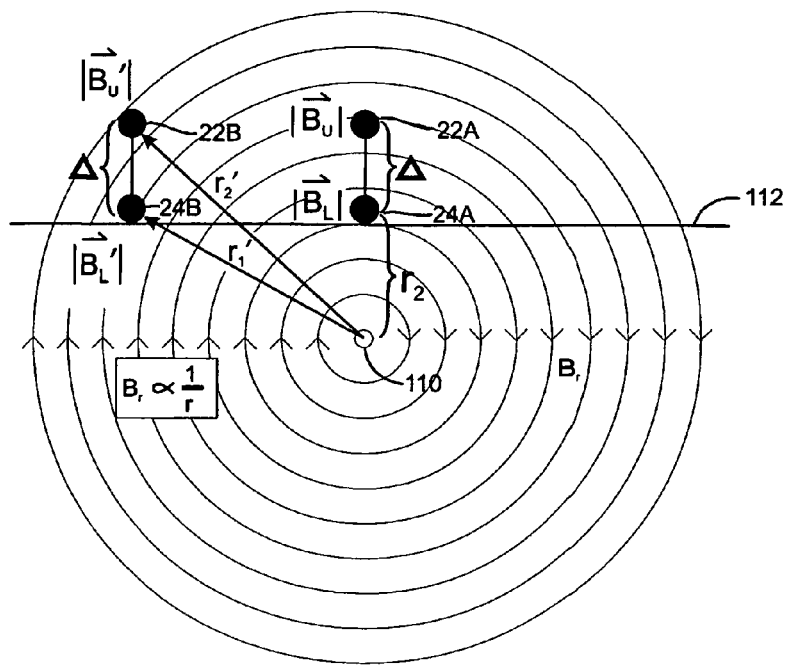
$$r_2 = \frac{B_U \triangle}{B_L - B_U}$$
FIG. 7A
$$V_r \equiv \frac{B_U' \triangle}{B_L' - B_U'}$$
FIG. 7B
$$V_r \equiv \frac{B_U' - B_L'}{B_U' + B_L'}$$
FIG. 7C
FIG. 7
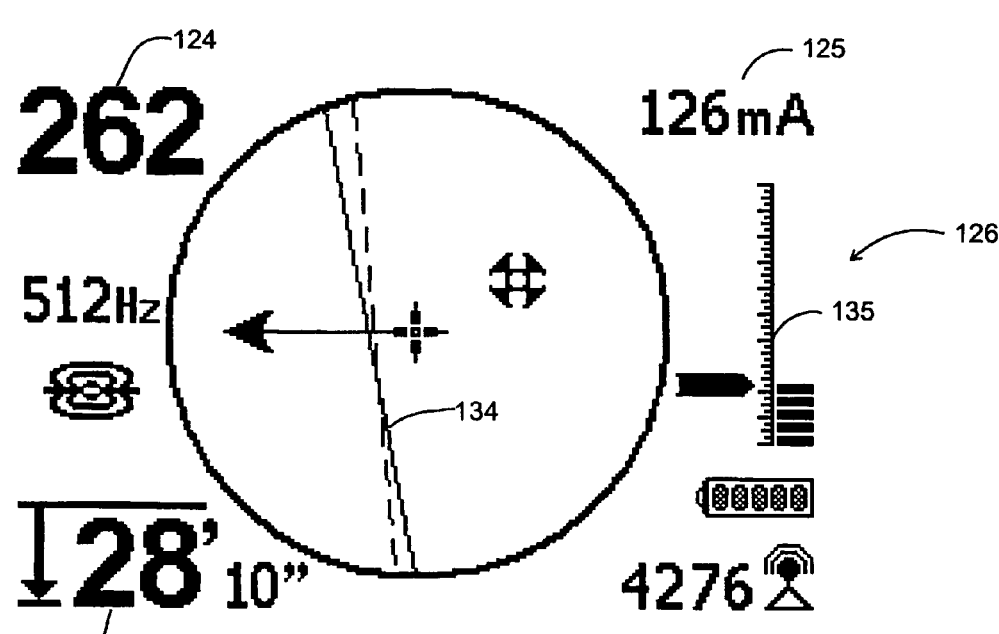
FIG. 9

LOCATOR WITH APPARENT DEPTH INDICATION

CROSS-REFERENCES TO RELATED APPLICATIONS

This application is related by common inventorship and subject matter to the commonly-assigned patent application Ser. No. 10/268,641, published on Apr. 15, 2004 as U.S. Patent Application No. 2004/0070399 A1, which is entirely incorporated herein by this reference. This application is also related by common inventorship and subject matter to the commonly-assigned patent application Ser. No. 10/308,752, published on Apr. 15, 2004 as U.S. Patent Application No. 2004/0070525 A1, which is entirely incorporated herein by this reference. This application is also related by common inventorship and subject matter to the commonly-assigned patent application Ser. No. 10/956,328 filed on Oct. 1, 2004, and patent application Ser. No. 11/054,776 filed on Feb. 9, 2005, which are both entirely incorporated herein by this reference.

BACKGROUND OF THE INVENTION

1. Field of the Invention

This invention relates generally to systems for locating and tracing buried objects and more particularly to a system for detecting and tracing buried objects by means of automated active and passive signal event detection.

2. Description of the Related Art

There are many situations where is it desirable to locate buried utilities such as pipes and cables. For example, before starting any new construction that involves excavation, worker safety and project economic concerns require the location and identification of existing underground utilities such as underground power lines, gas lines, phone lines, fiber optic cable conduits, CATV cables, sprinkler control wiring, water pipes, sewer pipes, etc., collectively and individually herein denominated "buried objects." As used herein, the term "buried objects" includes objects located inside walls, between floors in multi-story buildings or cast into concrete slabs, for example, as well as objects disposed below the surface of the ground. If excavation equipment such as a backhoe hits a high voltage line or a gas line, serious injury and property damage may result. Unintended severing of water mains and sewer lines generally leads to messy and expensive cleanup efforts. The unintended destruction of power and data cables may seriously disrupt the comfort and convenience of residents and bring huge financial costs to business.

Accordingly, the art is replete with proposed solutions to the buried object locating problem. For example, it is known to locate buried ferromagnetic objects either by detecting a localized change in free-space permeability with an inductive circuit element or by using a magnetic sensor to detect the fixed magnetic field (internal magnetic moment) emanating from the object. The presence of such ferromagnetic objects also distorts the Earth's magnetic field in a manner that is known to have utility for locating. Still other buried objects, such as conductive lines and pipes, may be located by first applying an external electromagnetic signal to the object to thereby energize the object with a nonzero frequency magnetic field that may be detected by a magnetic sensor. For example, an external electrical signal source (transmitter) having a frequency in the range of approximately 4 Hz to 500 kHz has a well-known utility for energizing conductive objects by direct electrical coupling to permit their location. Some buried cables, such as power lines and some communication lines, for example, are already energized and therefore characterized by the emission of an electromagnetic signal that includes a non-zero frequency magnetic field that may be detected by a magnetic sensor. These examples of active and passive location of buried long conductors are also commonly denominated "line tracing." As another example, an external transmitter, beacon or duct probe (a "sonde") is an external electromagnetic signal source having well-known utility for marking the location of any non-conductive buried object into which it may be physically introduced. A sonde typically includes a coil of wire wrapped around a ferromagnetic core that is packaged for insertion into a buried nonconductive conduit, such as a plastic utility runway or a concrete water pipe.

When locating buried objects before excavation, it is further desirable to determine the approximate depth of the objects. This is generally attempted by measuring the characterizing emission field strength at two locations and analyzing the differences to infer the location of the emission source. However, there are many instances where the land that is to be excavated may be traversed or crisscrossed by several different utilities such as an electrical power cable, a water line, a gas line, a sewer pipe and a communications line. It is highly desirable to be able to determine their paths and their depths all at the same time. Also, many sites are host to a variety of overhead power and related lines, which emit electromagnetic fields that cannot be readily segregated from the emissions of similar buried lines. Some transmitters known in the art can produce several different signals at different frequencies for application to the same underground object or even to different underground objects, but a problem with these systems arises when several pipes are located in the same area and the location of all pipes is desired. Signals transmitted by several pipes can interfere and complicate the detection process.

Practitioners in the art have proposed numerous refinements to the magnetic field detector intended to facilitate the location of underground objects. For example, in U.S. Pat. No. 4,843,324, Humphrey, Jr. et al. teach that band-limited measurements from a single sensor in two positions are more accurate than two simultaneous measurements from two spaced-apart sensors for determining the magnetic gradient required to estimate buried object depth. U.S. Pat. No. 6,777,923 issued to Pearson discloses a method for detecting the magnetic field gradient by means of two magnetic sensors separated by a fixed distance. Pearson teaches the use of a simple threshold detection method that permits the dual sensors to operate in a self-calibrating mode to ensure accuracy of the measured gradient. Pearson tests the measured gradient against a predetermined threshold to produce an indicator signal representing a simple "object present" event, which is communicated to the user by means of a User Interface (UI). Similarly, U.S. Pat. No. 6,107,801 issued to Hopwood et al. discloses a method for estimating the distance from sensors to sonde dipole field by comparing the ratio of two orthogonal magnetic field basis elements to that computed for a sonde field predicted in accordance with a sonde a tilt detector output. In U.S. Pat. No. 6,268,731, Hopwood et al. disclose a magnetic field detector having three spaced-apart sensor arrays each having differing sensor orientations. Hopwood et al. suggest that the user move along while sweeping their locator from side to side and listening to audio signals representing the relative values of the three sensor array outputs, thereby assigning the entire location event detection burden to the user. In U.S. Pat. No. 6,140,819, Peterman et al discloses an apparatus with two spaced-apart sensors that employs a phase-lock loop (PLL) circuit for locking a magnetic field sensing circuit to the signal used to energize a buried utility line, thereby permitting the continuous indication of a magnetic field gradient representing the estimated object depth (instead of the earlier "halt-and-read" depth estimation method). None of these useful disclosures suggests a dispositive solution to the well-known magnetic gradient accuracy problems encountered with one-dimensional (1D) and two-dimensional (2D) sensor arrays, which may be understood by recalling that a magnetic field gradient in three-space has nine components, five of which are independent. These five independent components cannot be completely resolved with less than five independent magnetic sensor measurements.

Modern utility line tracing places complex demands on the locator user, who may be obliged to detect one or more buried objects in a crowded or noisy environment. Presently in the art, the actual location and tracing of a buried object obliges the locator user to receive, review and evaluate a variety of signals from the magnetic signal detection apparatus UI. For example, it is known to provide an audio UI signal representing the detection of a magnetic field that is stronger than a predetermined threshold. As the locator user hears the audio UI signals and moves the locator sensor about, the user must evaluate how the signal changes with respect to the sensor motion and adapt the motion to this information in order to eventually conclude a probable location for the buried object characterized by the emission of the magnetic field being detected. This process may be described as a series of "event" detections by the user; that is, for example, the user first detects an event representing a nearby pass of the sensor over the object sought, whereupon the user changes the sensor positions in a manner intended to elicit another event and so forth until a series of such events informs the user of the object location. While this may appear simple in principle, the reality is that the user must recursively process a large amount of information to determine an object location even when such determination is possible.

Effective detection and tracing of utility lines is vital to the safety of field personnel for many reasons; for example, the unplanned rupture of a high-pressure natural gas line can endanger the lives of everybody in the vicinity. Because of the important physical safety issues involved in line detection and tracing, both for the excavators and the locator users preceding them, several practitioners have proposed improving the quality of utility line location and tracing by moving some of the event-detection burden from the locator user to the locator apparatus itself. Such a system must provide for the simultaneous detection and identification of either a passively-emitting buried object such as a ferromagnetic mass or an energized power cable or an actively-energized buried object such as a conductive pipe energized by means of an external transmitter signal or a non-conductive conduit occupied by an energized sonde, or all simultaneously, for example.

Many practitioners propose various solutions to this multiple event-detection and separation problem. For example, U.S. Pat. No. 5,093,622 issued to Balkman discloses a locating apparatus that provides a new formula for comparing the output signals from two spaced-apart magnetic sensors to automatically detect a "cross-over" event when the sensor passes directly over the buried object sought. Similarly, U.S. Pat. No. 5,621,325 issued to Draper et al. discloses a method for using two orthogonal magnetic field basis vectors to discriminate between actual detections and "ghost" detections by signaling the actual event detection to the user while ignoring the "ghost" detections. However, these useful suggestions alone do little to shift the increased event processing burden from the user to the apparatus.

The above commonly-assigned patent applications propose several improvements to the magnetic field measurement and line locating art, including the use of simultaneous measurement of magnetic field vectors in a plurality of independent frequency regions and the introduction of multiple 3D sensor arrays for measuring magnetic field vectors and the introduction of an improved Graphical UI for line tracing.

The measurement of the magnetic field gradients can be more useful than the simpler measurement of the magnetic field vectors for detecting electromagnetic emissions because magnetic gradiometry is less susceptible to distant interfering signals such as those from overhead power lines. For example, in a dipole field, the gradient declines with the fourth power of distance from an emitter while the field declines with the third power of distance. In a cylindrical field, the gradient retains this noise-reduction advantage by declining as the square of the distance from the emitter while the field declines linearly with distance. Although magnetic gradiometry is known in the art, true gradient measurement requires at least five independent simultaneous magnetic field measurements to completely determine the nine magnetic gradient tensor elements. To reduce the expense of the numerous independent sensors required, magnetic gradients are often merely approximated in the art by employing assumptions about the magnetic field geometry and by ignoring or resolving in some other manner the resulting location ambiguities. This well-known difficulty may be appreciated with reference to, for example, a Department of Justice Research Report by Czipott [Czipott, "Stand-Off Detection and Tracking of Concealed Weapons Using Magnetic Tensor Tracking," U.S. Department of Justice Research report #189583, 8 Aug. 2002], who discusses the importance of measuring the entire magnetic gradient tensor in facilitating the location of ferromagnetic objects. Also, U.S. Pat. No. 5,777,477 issued to Wynn describes the practical difficulties in measuring the five independent gradients of a magnetic field at a single point while in motion, suggesting that even when measuring the 3D magnetic vector to eliminate "ghost" solutions to the location vector arising from the gradient tensor alone, stationary measurement is usually necessary for detecting weak ferromagnetic signatures. Wynn discloses a computational method that permits continuous nonambiguous solutions for the location vector when both the entire five-element gradient tensor and the complete three-element magnetic field vector are measured at each point.

Another well-known portable locator problem is the convolution of any locator system user motion with the received emission signal. In operation, a portable locator system is typically swung side to side or about in a large arc to obtain an initial estimate of the direction to a buried object such as a utility line. Even when tracing a buried utility line following its detection, small path deviations may cause signal phase reversals at the sensors whose axes are aligned substantially perpendicular to the local magnetic field vector. This problem arises in sensor coil embodiments where sensor signal sensitivity is generally proportional to the sine of the angle between the sensor coil axis and the local field vector. When the sensor coil axis is substantially aligned with the local field, the near-zero value for the sine of that angle fluctuates rapidly with the angle so that minute angular changes arising from locator system motion can cause large changes in sensor signal amplitude and phase. Until now, there were no proposed solutions to this locator sensor alignment problem.

Accordingly, there is still a clearly-felt need in the art for an improved method for automatic location of buried objects in a crowded and noisy environment. These unresolved problems and deficiencies are clearly felt in the art and are solved by this invention in the manner described below.

SUMMARY OF THE INVENTION

This invention addresses the above unresolved problems by introducing for the first time a locator with integral event detection in combination with improved measurement of the horizontal magnetic field asymmetry and improved user interface (UI) integration. This invention arises in part from the unexpectedly advantageous observation that two horizontally-spaced one-dimensional sensors disposed proximate to two vertically-spaced three-dimensional sensor arrays operate to produce reliable horizontal field asymmetry measurements without disabling the three-dimensional field vector measurements. Such horizontal field asymmetries are unexpectedly useful in determining an accurate "virtual depth" measurement, primarily because the locator user may use them to reorient the locator assembly azimuthally with respect to the buried utility line and thereby optimize locator signal-to-noise ratio (SNR). The resulting virtual depth measurements are sufficiently accurate to produce reliable automatic detection events in accordance with the system of this invention. As used herein, the term "virtual depth" denominates a distance measure related to the separation of the locator system from the target object.

It is a purpose of this invention to provide sufficient independent magnetic field measurements to permit accurate determination of virtual depth (by relating accurate magnetic gradient data to virtual depth). It is a feature of this invention that, for optimal horizontal field asymmetry measurements, the two independent horizontally-spaced gradient sensors may be oriented orthogonally to a buried utility line by the user, thereby producing virtual depth measurements of unprecedented accuracy.

It is another purpose of this invention to provide automatic event detection based on a single magnetic gradient measurement or a coordination of magnetic field measurements in a plurality of predetermined frequency regions. It is a feature of this invention that the electromagnetic emission may be simultaneously measured and displayed in a plurality of different frequency regions to produce field and gradient measurements in each.

It is yet another purpose of this invention to provide an improved buried conductor current-measuring capability using horizontal gradient information to determine when to calculate and display a current measurement. It is a feature of this invention that the processor automatically captures and displays a measured current value when the measured horizontal gradient is approximately zero, indicating a position of minimum distance when the locator is centered above a buried utility line target. This element of the invention overcomes a key problem in the art by facilitating the automatic measurement of current only when the portable locator traverses directly above the utility line target of interest, wherefrom the true distance to the buried utility lin can be accurately determined.

In one aspect, the invention is a human-portable utility locator system comprising two sensor arrays each for detecting the electromagnetic field emission, a processor coupled to the two sensor arrays for determining a B-field vector magnitude at each sensor array as a function of time within one or more frequency bands, a proximity detector coupled to the processor for producing a virtual depth signal representing the virtual depth of the electromagnetic field emission corresponding to the B-field vectors, and a user interface coupled to the proximity detector for generating an acoustic signal for transmission to a user, wherein the acoustic signal includes a frequency that varies inversely to any variation of the virtual depth signal.

In another aspect, the invention is a human-portable utility locator system comprising two sensor arrays each for detecting the electromagnetic field emission, a processor coupled to the two sensor arrays for determining the B-field gradient between them as a function of time within at least one frequency band, an event detector coupled to the processor for detecting an event corresponding to an extremum in the B-field gradient with respect to time, and a user interface coupled to the event detector for signaling the detected event to a user.

In a preferred embodiment, the invention is a human-portable utility locator system comprising a first pair of spaced-apart electromagnetic sensor arrays disposed on a first axis, each array including a plurality of electromagnetic field sensors, each sensor having a sensing axis disposed substantially orthogonal to the other sensing axes in the array, a second pair of spaced-apart electromagnetic sensors disposed on a second axis, each sensor having a sensing axis disposed substantially parallel with the second axis, and a supporting structure for fixing the second axis between the first pair of spaced-apart electromagnetic sensor arrays and substantially orthogonal to the first axis.

The foregoing, together with other objects, features and advantages of this invention, can be better appreciated with reference to the following specification, claims and the accompanying drawing.

BRIEF DESCRIPTION OF THE DRAWINGS

For a more complete understanding of this invention, reference is now made to the following detailed description of the embodiments as illustrated in the accompanying drawing, in which like reference designations represent like features throughout the several views and wherein:

FIG. 7 is a schematic diagram illustrating the operation of the vertically-spaced field vector sensor elements of the locator systems of FIGS. 1-4 in a magnetic field emitted by a buried utility line.

FIG. 7A illustrates the computation of respective field vector magnitudes in computing depth.

FIG. 7B illustrates the computation of the respective field vector magnitudes in computing the "virtual depth."

FIG. 7C illustrates another manner of calculating the "virtual depth" in which the vertical gradient is treated strictly as a gradient.

FIGS. 8A-E, are graphical diagrams illustrating several of the features employed in an exemplary embodiment of the locator system of this invention.

FIG. 9 is a schematic diagram illustrating an exemplary embodiment of the Graphical User Interface (GUI) element of the locator system of this invention.

DETAILED DESCRIPTION OF THE EMBODIMENTS

Figure 1:
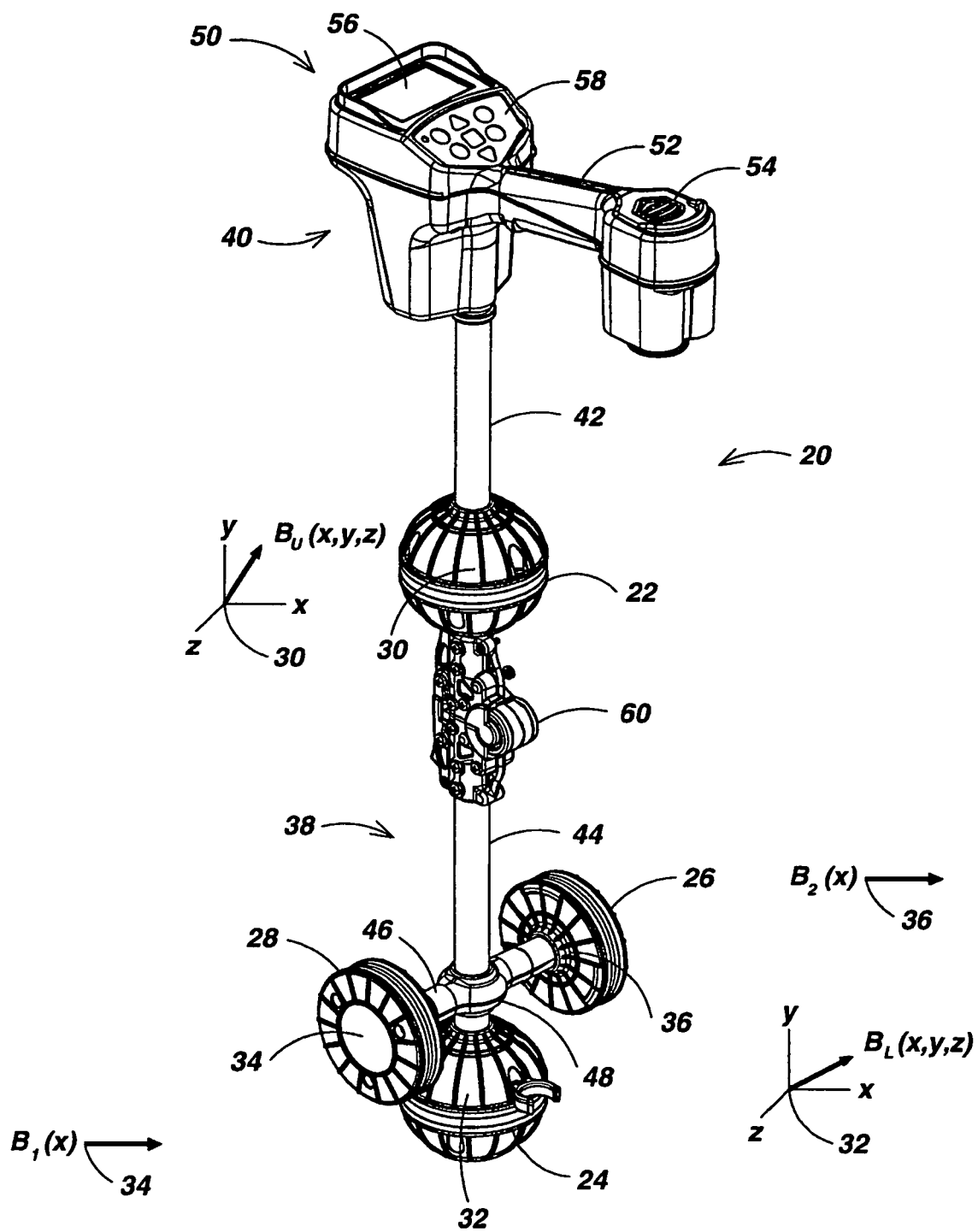
FIG. 1 is a perspective view illustrating a preferred embodiment of the locator system of this invention shown in an operational configuration.

FIG. 1 is a perspective view illustrating a preferred embodiment 20 of the locator system of this invention shown in an operational configuration. Locator system 20 includes a first pair of electromagnetic sensor arrays 22 and 24 that are vertically spaced apart from one another a second pair of electromagnetic sensors 26 and 28 that are horizontally spaced apart from one another and disposed between sensor arrays 22 and 24 during operation. Sensor arrays 22 and 24 each preferably include three individual sensor elements (not shown) each having a sensor axis disposed in a mutually orthogonal arrangement that facilitates the detection of the three-dimensional (3D) electromagnetic field vector $B_U(x,y,z)$ at the upper array centroid 30 and the 3D electromagnetic field vector $B_L(x,y,z)$ at the lower array centroid 32. The preferred details of sensor arrays 22 and 24 may be readily appreciated with reference to the above-cited commonly-assigned patent applications, which are fully incorporated herein by reference. Sensors 26 and 28 each preferably include at least one electromagnetic sensor having a sensor axis disposed to facilitate the detection of the horizontal electromagnetic field component $B_1(x)$ at the left sensor centroid 34 and the horizontal electromagnetic field component $B_2(x)$ at the right sensor centroid 36. The individual sensor elements (not shown) in locator system 20 may be embodied as any combination of simple air-core coil antennas or any other useful electromagnetic sensing devices known in the art, such as, without limitation, iron or ferrite core magnetic sensing coils, giant magnetoresistive effect (GMR) sensors, flux gate magnetic sensors, Hall effect devices, etc.

The preferred spatial relationships among vertically-spaced sensor arrays 22-24 and horizontally-spaced sensors 26-28 are fixed by means of a supporting structure 38, which is also coupled to a housing assembly 40 by means of a member 42 substantially as shown. Supporting structure 38 includes a vertical member 44 coupling sensor array 22 to sensor array 24, thereby defining a first axis between them, and a horizontal member 46 coupling sensor 26 to sensor 28, thereby defining a second axis between them. Members 44 and 46 are joined at a junction 48 such that their respective axes are fixed in a substantially orthogonal relationship, which is preferred. Sensors 26-28 are preferably centered with respect to lower sensor array 24 to minimize the mutual inductance of the sensors in lower sensor array 24 with sensors 26-28 and the resulting distortion. Sensors 26-28 are preferably disposed as close to the lower end of locator system 20 (and the buried targets) as possible for better signal strength and more accurate sensing of minimally distorted position without being so close that the resulting mutual inductance overcomes the other advantages. Spacing sensors 26-28 farther apart reduces mutual inductance problems but also makes storage and portability more difficult.

Housing assembly 40 includes a user interface (UI) 50 and a handle 52 disposed to allow the locator user (not shown) to position and control locator system 20. UI 50 is provided to facilitate the transfer of information and commands between the user and locator system 20 and preferably includes an audio interface exemplified by the speaker 54, a visual display 56 and a keypad 58. The interior of housing 50 (not visible) includes the audio interface and several other processor, user interface and detector elements that are described below in detail in connection with FIGS. 9-11.

Figure 2:
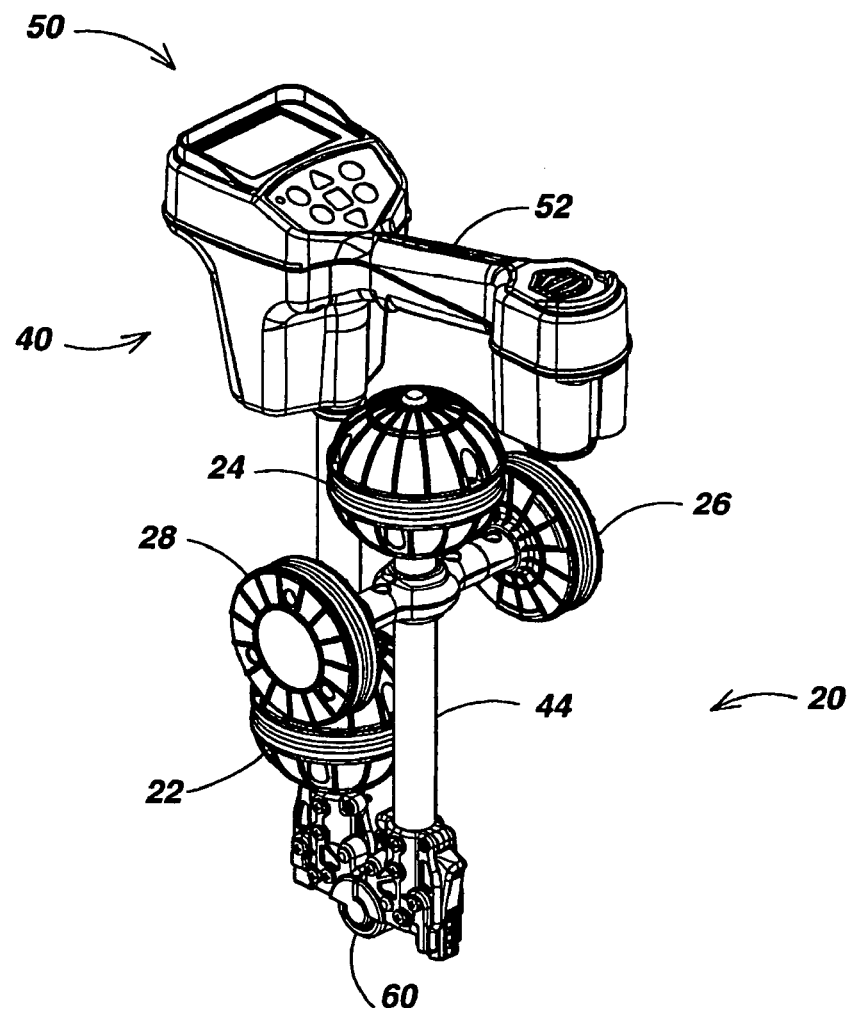
FIG. 2 is a perspective view illustrating the locator system embodiment of FIG. 1 shown in a folded storage configuration.

FIG. 2 is a perspective view showing locator system 20 in a folded transportation and storage configuration facilitated by the hinge assembly 60 disposed within supporting structure 38. This folded transportation and storage configuration is not essential to the utility of locator system 20 but is preferred for convenience and safety purposes.

Figure 3:
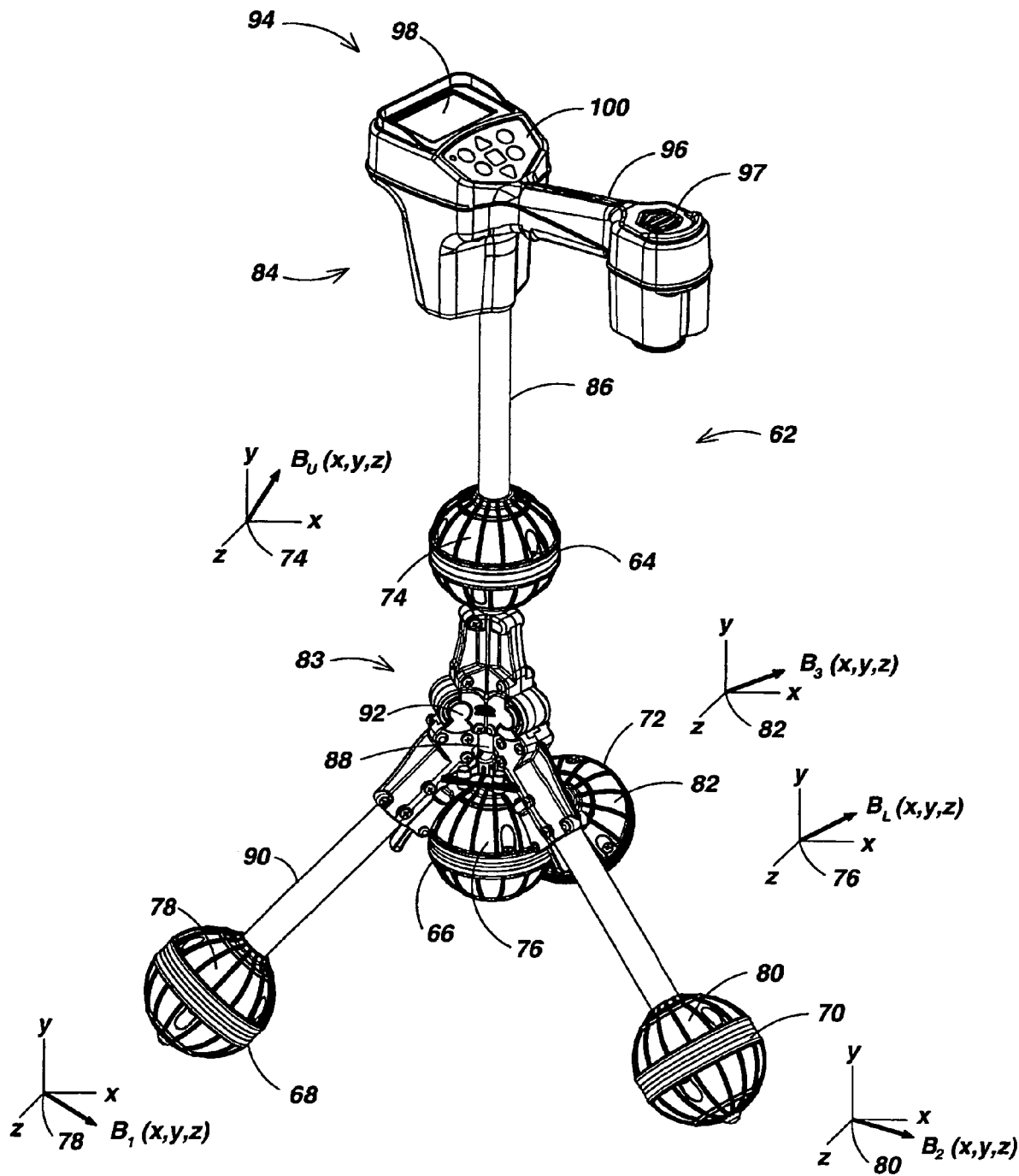
FIG. 3 is a perspective view illustrating an alternative embodiment of the locator system of this invention shown in an operational configuration.

FIG. 3 is a perspective view illustrating an alternative 3D tripod embodiment 62 of the locator system of this invention shown in an operational configuration. Locator system 62 includes a first pair of electromagnetic sensor arrays 64 and 66 that are vertically spaced apart from one another and a second triplet of electromagnetic sensor arrays 68, 70 and 72 that are spaced apart from one another and disposed in a plane below sensor arrays 64 and 66 that may be substantially horizontal during operation. Sensor arrays 64-72 each preferably include three individual sensor elements (not shown) each having a sensor axis disposed in a mutually orthogonal arrangement that facilitates the detection of the 3D electromagnetic field vector $B_U(x,y,z)$ at the upper array centroid 74, the 3D electromagnetic field vector $B_L(x,y,z)$ at the lower array centroid 76, and the 3D electromagnetic field vectors $B_1(x,y,z)$, $B_2(x,y,z)$ and $B_3(x,y,z)$ at the respective coplanar array centroids 78, 80 and 82.

The preferred spatial relationships among vertically-spaced sensor arrays 64-66 and coplanar sensor arrays 68-72 are fixed by means of a supporting structure 83, which is also coupled to a housing assembly 84 by means of a member 86 substantially as shown. Supporting structure 83 includes a vertical member 88 coupling sensor array 64 to sensor array 66, thereby defining a first axis between them, and a plurality of tripod members, exemplified by the tripod member 90, coupling coplanar sensor array 68-72 to one another and thereby defining a plane. Vertical member 88 and the tripod members exemplified by member 90 are joined at junctions exemplified by the hinged junction 92 whereby coplanar sensor arrays 68-72 are fixed in a plane disposed substantially orthogonal to the axis defined by vertical member 88, as is preferred.

Housing assembly 84 includes a user interface (UI) 94 and a handle 96 disposed to allow the locator user (not shown) to position and control locator system 62. UI 94 is provided to facilitate the transfer of information and commands between the user and locator system 62 and preferably includes an audio interface exemplified by the speaker 97, a visual display 98 and a keypad 100. The interior of housing 84 (not visible) includes the audio interface and several other processor, user interface and detector elements that are described below in detail in connection with FIGS. 9-11.

Figure 4:
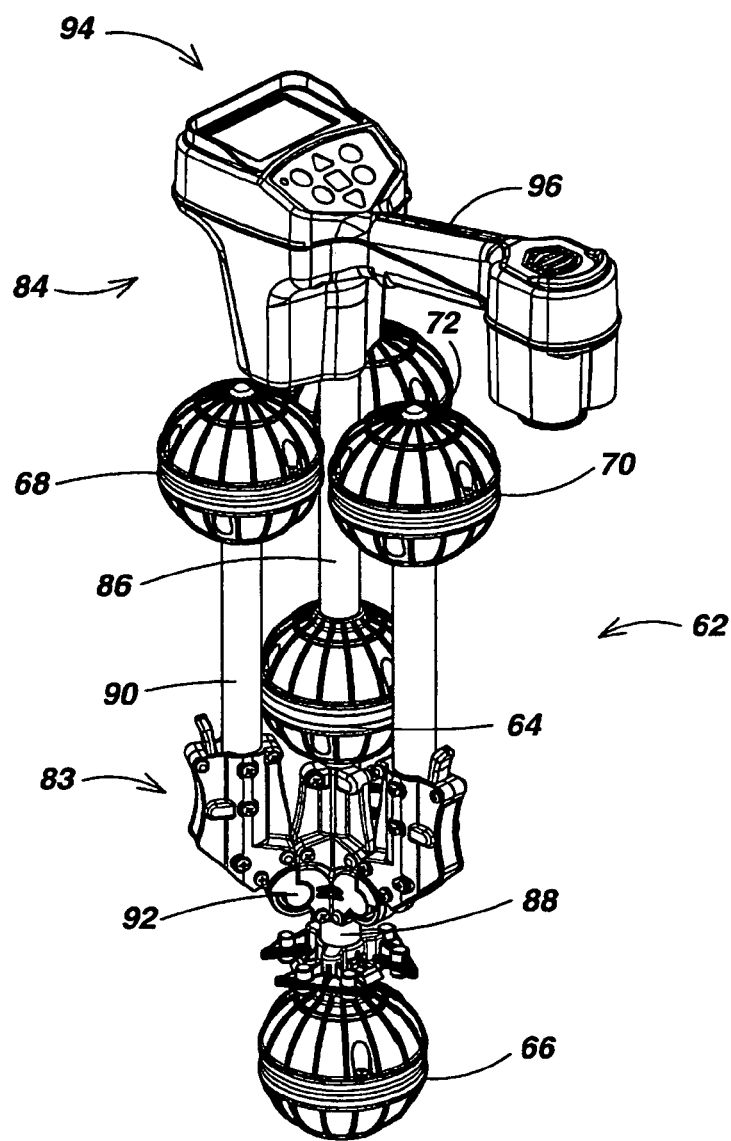
FIG. 4 is a perspective view illustrating the locator system embodiment of FIG. 3 shown in a folded storage configuration.

FIG. 4 is a perspective view showing locator system in a folded transportation and storage configuration facilitated by the junctions exemplified by the hinged junction 92 disposed within supporting structure 83. This folded transportation and storage configuration is not essential to the utility of locator system 62 but is preferred for convenience and safety purposes.

The above-cited commonly-assigned patent application Ser. No. 10/956,328 discloses and describes the operation and utility of the three-dimensional (3D) tripod sensor configuration employed in locator system 62. Multiple sensors are distributed (preferably as arrays of three orthogonal sensors) over a 3D volume to facilitate measurement of the volumetric properties of the electromagnetic field, thereby providing a more accurate estimate of the true position of the object of interest. This improvement arises in part from an improved estimate of the true gradient tensor, which may be appreciated with reference to the three orthogonal components of the magnetic field vector and the nine components of the magnetic gradient tensor illustrated in FIG. 5.

Gradients are sometimes more useful for detecting nearby weakly-emitting sources and than are scalar or vector fields alone. Because gradient strength decreases with distance more rapidly than field strength, nearby sources are preferentially detected and distant sources are more easily rejected. A gradient is measured by finding the difference between two magnetic field measurements such as each successive pair of the 3D field vector B(x, y, z) sensors 102, 104 and 106 shown in FIG. 5. When normalized with respect to the separation between sensor pairs, each difference forms the projection of the magnetic gradient G in the direction of the line between the two sensors. There are three linearly-independent field vector components $\{B_x, B_y, B_z\}$ each of which varies in three linearly-independent directions $\{x, y, z\}$, making nine gradients. A magnetic gradient tensor, mathematically expressed as [G] (FIG. 5), may be computed where the components are the partial derivatives of the magnetic field vector components at a single point. For example, sensors 104 and 106 provide data sufficient to determine the change of each of the components $\{B_x, B_y, B_z\}$ with respect to the horizontal dimension (x). These three values are the tensor elements $\{G_{xx}, G_{yx}, G_{zx}\}$, which compose the first column of gradient tensor [G] and which may be written as the partial differentials of the three magnetic field vector components with respect to the horizontal dimension (x). Because both the divergence and curl of a magnetostatic field must equal zero in a sourceless volume, this tensor is traceless and symmetric, having only five independent components; three diagonal and two unique off-diagonal values.

Although the magnetic gradient tensor [G] and the field vector B(x, y, z) provide a complete description of the magnetic field at any point to the first order, simple field vector B(x, y, z) measurements alone may not provide sufficient independent measurements to completely define the gradient tensor [G] at a single point during locator movement by the user. However, a complete definition of [G] is not necessary to the advantageous practice of the system and method of this invention, which uses a measure of the Euclidean vector sum of the vertical magnetic gradient components $\{G_{xy}, G_{yy}, G_{zy}\}$ and a measure of the horizontal field asymmetry $G_{xx}$ to determine a "virtual depth" in the manner described below with reference to FIGS. 6 and 7. The "virtual depth" function, as used herein, is a function of the projection onto a line connecting sensor array centroids 30 and 32 (FIG. 1) of the gradient of the field vector magnitude (a scalar quantity, thus, its gradient transforms like a vector). This gradient of the vector magnitude (a first rank tensor derivative of a scalar field) is fundamentally different from the gradient of the magnetic field (a second rank tensor derivative of a vector field). As used herein, the virtual depth is assumed to be equal to the actual depth of the target if and only if the direction of the B-field vector magnitude gradient is parallel to this line connecting array centroids 30 and 32.

Figures 5, 6, 6A:
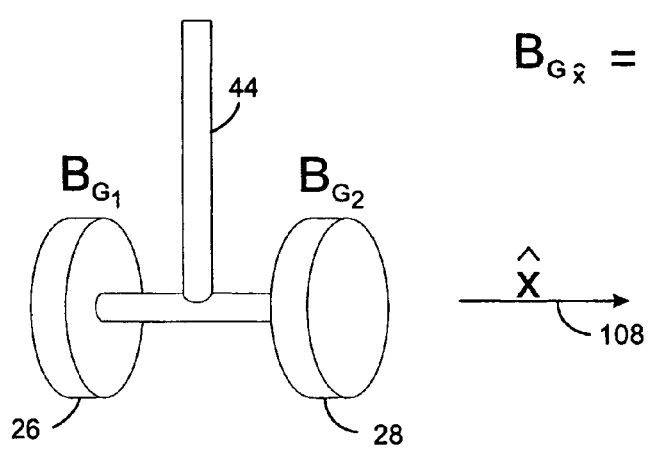
FIG. 5 is a schematic diagram illustrating the three orthogonal components of the magnetic field vector and the nine components of the magnetic gradient tensor.
FIG. 6 is a schematic diagram illustrating the operation of the horizontally-spaced gradient sensor elements of the locator system of FIGS. 1-2 in a magnetic field emitted by a buried utility line.
FIG. 6A illustrates the calculation of the horizontal field asymmetry with the horizontally-spaced pair of electromagnetic sensors illustrated in FIG. 6.

FIG. 6 is a schematic diagram illustrating the operation of the horizontally-spaced pair of electromagnetic sensors 26 and 28 of FIGS. 1-2 in a magnetic field emitted by a buried utility line. Sensors 26 and 28 each provide a respective signal $B_{G1}$ and $B_{G2}$ representing two spaced apart samples of the horizontal magnetic field component $B_x$ in the direction indicated by the arrow 108. The horizontal field asymmetry $G_{xx}$ normalized for the separation distance is calculated as shown in FIG. 6A. Although the linearly-independent coordinates $\{x,y,z\}$ are fixed with respect to locator system 20, during operation, the horizontal direction (x) may be reoriented to any azimuth by the user. According to the method of this invention, locator system 20 (FIGS. 1-2) is reoriented by the user to realign arrow 108 and make it substantially orthogonal to the estimated route of the detected buried utility line to optimize SNR and the virtual depth measurement accuracy. Although locator system 62 (FIGS. 3-4) does not include a horizontally-spaced sensor pair analogous to sensors 26-28, coplanar arrays 68, 70 and 72 each provide signals representing all three components $\{B_x, B_y, B_z\}$ of the field vector B(x, y, z) from which the horizontal magnetic field component ($B_x$) in the direction of arrow 108 may be easily obtained at each of the three arrays in the usual manner and employed by the user to azimuthally reorient locator system 62 to optimize the vertical gradient measurement SNR. Although locator system 62 is a useful embodiment of the system of this invention, locator system 20 is preferred as being simpler and requiring fewer sensors.

FIG. 7 is a schematic diagram showing the vertically-spaced pair of electromagnetic sensor arrays 22 and 24 of FIGS. 1-4 operating in a magnetic field $B_r$ (having one or more frequencies) emitted by a utility line 110 buried below ground level 112 while separated by distance Δ. Sensor arrays 22 and 24 are illustrated in two positions that are labeled as positions 22A-24A and 22B-24B substantially as shown. Positions 22A-24A are disposed directly above utility line 110 where the horizontal component $B_x$ of the cylindrical field $B_r$ has a local maximum value, with array 24 disposed at a distance $r_2$ from line 110 and array 24 disposed at a larger distance $r_1=(r_2+\Delta)$ therefrom. Positions 22B-24B are disposed laterally some distance to the left of utility line 110 where the horizontal field component $B_x'<B_x$ has a substantially lower value, with array 24 disposed at a distance $r_2'>r_2$ from line 110 and array 24 disposed at a larger distance $r_1'>(r_2'+\Delta)$, therefrom. In operation, there is a small gap (e.g., 5 cm) between lower array centroid 32 and ground level 112, which may easily be accounted for in the virtual depth signal processing system.

At locations 22A-24A, arrays 22 and 24 each provide signals representing the magnitude (e.g., root-mean-square value of a frequency component) of the three orthogonal components $\{B_x, B_y, B_z\}$ of the local field vectors $B_U(x, y, z)$ and $B_L(x, y, z)$, respectively. The respective field vector magnitudes $|B_U|$ and $|B_L|$ may then be computed as a Euclidean vector sum of the vector components for use in computing the depth $r_2$ as shown in FIG. 7A. This is a true depth calculation because arrays 22 and 24 are disposed directly over line 110. The electromagnetic field emitted from line 110 is assumed to decay linearly with respect to distance (assuming a cylindrical geometry).

At locations 22B-24B, arrays 22 and 24 each provide signals representing the three orthogonal components of the field vectors $B_U'(x, y, z)$ and $B_L'(x, y, z)$, respectively. The respective field vector magnitudes $|B_U'|$ and $|B_L'|$ may then be computed in the usual trigonometric manner for use in computing the "virtual depth" $V_r$ in a manner exemplified by the equation shown in FIG. 7B. This is a "virtual" depth calculation related to vertical gradient and not an actual depth calculation because arrays 22 and 24 are disposed at some lateral distance from line 110. The electromagnetic field emitted from line 110 may decay linearly with respect to distance but the utility of the virtual depth detection of this invention does not rely on determining actual distance. The virtual depth is related to separation distance but its utility arises from the extrema in the virtual depth signal and not from the virtual depth signal itself. The extremum is used to detect events that are then employed for the detection and estimation of actual utility line depth. A preferred embodiment shown in FIG. 7C treats the vertical gradient strictly as a gradient, which behaves much like the "virtual depth" parameter but has the advantage of being nicely bounded to the [0, 1] domain and has no singularity at $B_1=B_2$.

Advantageously, when locator system 20 is vertically positioned directly over line 110, the virtual depth and true depth values are identical and the virtual depth is minimized. This leads to the unexpectedly advantageous observation that the "virtual depth" $V_r$ may be monitored over time for extrema (minima in particular) as locator system 20 is moved along by the user, as may be appreciated with reference to the discussion with respect to FIGS. 8 and 10 below. The occurrence of a virtual depth $V_r$ minimum represents an "event" that indicates a passage of locator system 20 directly over line 110, and, according to the method of this invention, such an event may be automatically detected and signaled to the user, either as a particular audio signal or as a predetermined visual display, or both as may be appreciated with reference to the discussion with respect to FIGS. 8-9 below. Moreover, the virtual depth value may be determined for more than one B-field frequency; for example, the virtual depth signal may be monitored for "events" in several different frequency bands simultaneously, as may be appreciated with reference to the discussion with respect to FIG. 11 below.

Figure 8:
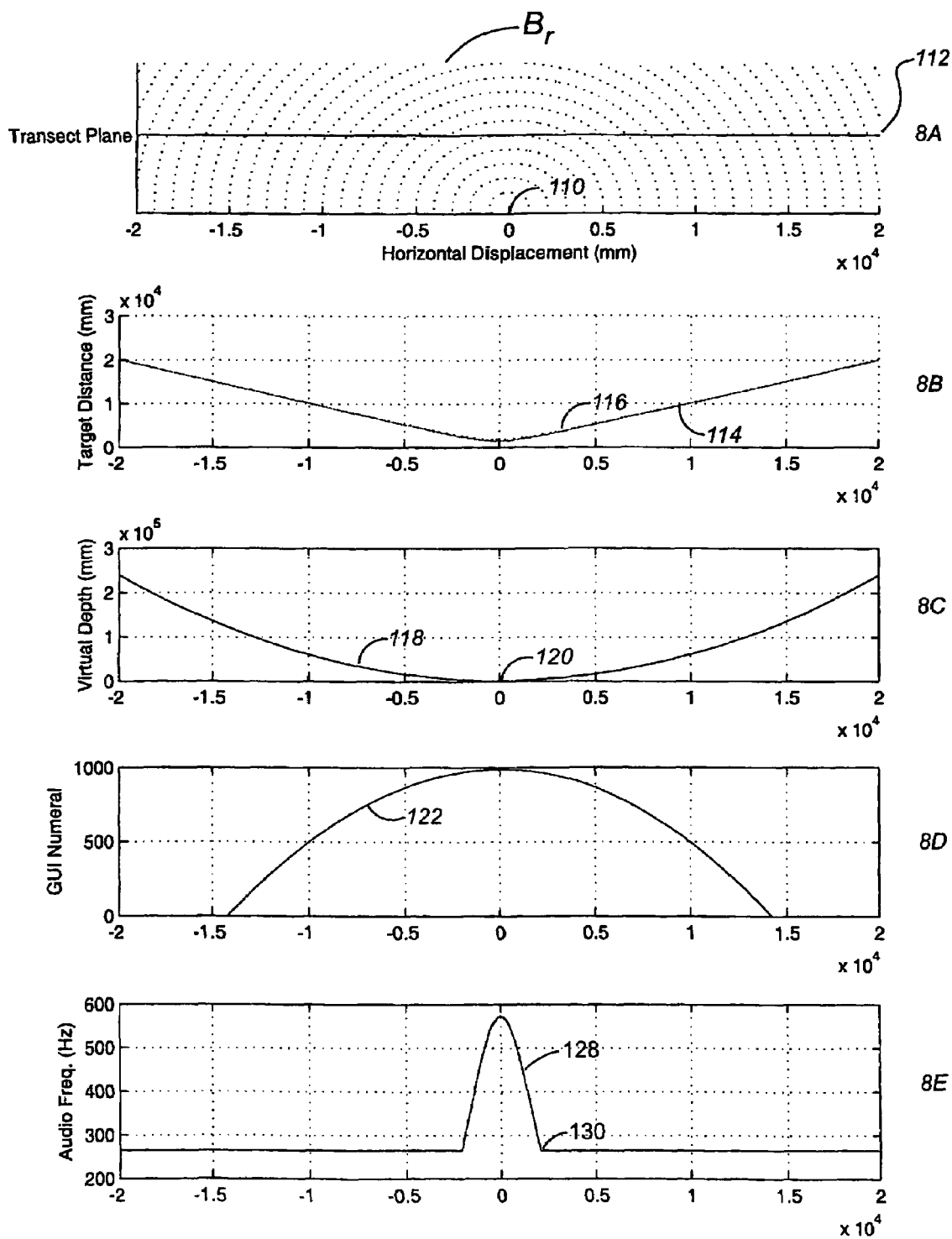
FIG. 8, comprising

FIG. 8, comprising FIGS. 8A-E, are graphical diagrams illustrating several of the features employed in locator system 20. FIG. 8A illustrates the cylindrical electromagnetic field $B_r$ emitted from buried utility line 110 and shows a transect plane at ground level 112 (FIG. 7) and defines an exemplary horizontal displacement scale in decameters. FIGS. 8A-E are scaled to the same horizontal displacement scale, which may be considered (for expository purposes) analogous to an "elapsed time" scale where the locator user moves from the left to the right at some velocity. In FIG. 8B, the line 114 represents the target distance from utility line 110 to array 22 (FIGS. 1-2 and 7) and the line 116 shows the target distance from utility line 110 to array 24 (FIGS. 1-2 and 7) with respect to horizontal displacement. In FIG. 8C, the line 118 represents the virtual depth $V_r$ (FIG. 7B) corresponding to the magnetic field vector magnitudes at the locations shown in FIG. 8B (assuming cylindrical geometry and no field distortion). Note that the extremum 120 occurs in line 118 at zero horizontal displacement.

The system of this invention includes several user signal schemes adapted for improved human factors in the communication of events to the user. One of these is a digital "proximity" numeral that is revalued inversely to changes in virtual depth 118. The line 122 in FIG. 8D illustrates exemplary values for the digital proximity numeral, which is illustrated as the proximity numeral display 124 in the exemplary Graphical User Interface (GUI) display embodiment 126 of FIG. 9. Another user signal scheme is the true line current display 125 (FIG. 9), which is presented only when the locator system is disposed directly above the utility line target. Yet another such user signal scheme of this invention is the auditory signal represented by the line 128 in FIG. 8F, which has a frequency that is varies monotonically with the inverse of virtual depth 118 above some predetermined threshold and is otherwise not present. An important feature of the signal frequency represented by line 128 is that it is thresholded so that no changes are made until the virtual depth signal drops below a threshold exemplified by the point 130 in FIG. 8E. Below such a threshold, reductions in virtual depth are reported to the user as significant INCREASES in audio frequency. Similarly, proximity numeral 124 is reported as an INCREASING value responsive to decreases in virtual depth 118, thereby indicating a higher "proximity" value to the user. The inverse monotonic relationships illustrated in FIGS. 8D-E are unexpectedly advantageous for improved human factors in the UI of this invention and neither "proximity" signal need correspond precisely to the actual proximity of the buried target to advantageously serve this purpose.

FIG. 9 is a schematic diagram illustrating exemplary GUI display 126, which may include a virtual depth numeral display 132 and a target utility bearing line 134, for example, in addition to proximity numeral display 124 and the proximity bar graph 135 displaying the graphical equivalent of proximity numeral display 124. GUI display 126 is suitable for use as visual display 56 (FIG. 1) or visual display 98 (FIG. 3), for example. Target utility bearing line 134 is useful for signaling the user to realign sensors 26-28 (FIGS. 1-2 and 6) orthogonally to the buried utility line, for example, which has the effect of aligning the cylindrical electromagnetic emission field with locator system 20 as illustrated in FIGS. 7 and 8A to provide more accurate virtual depth measurements.

Figure 14:
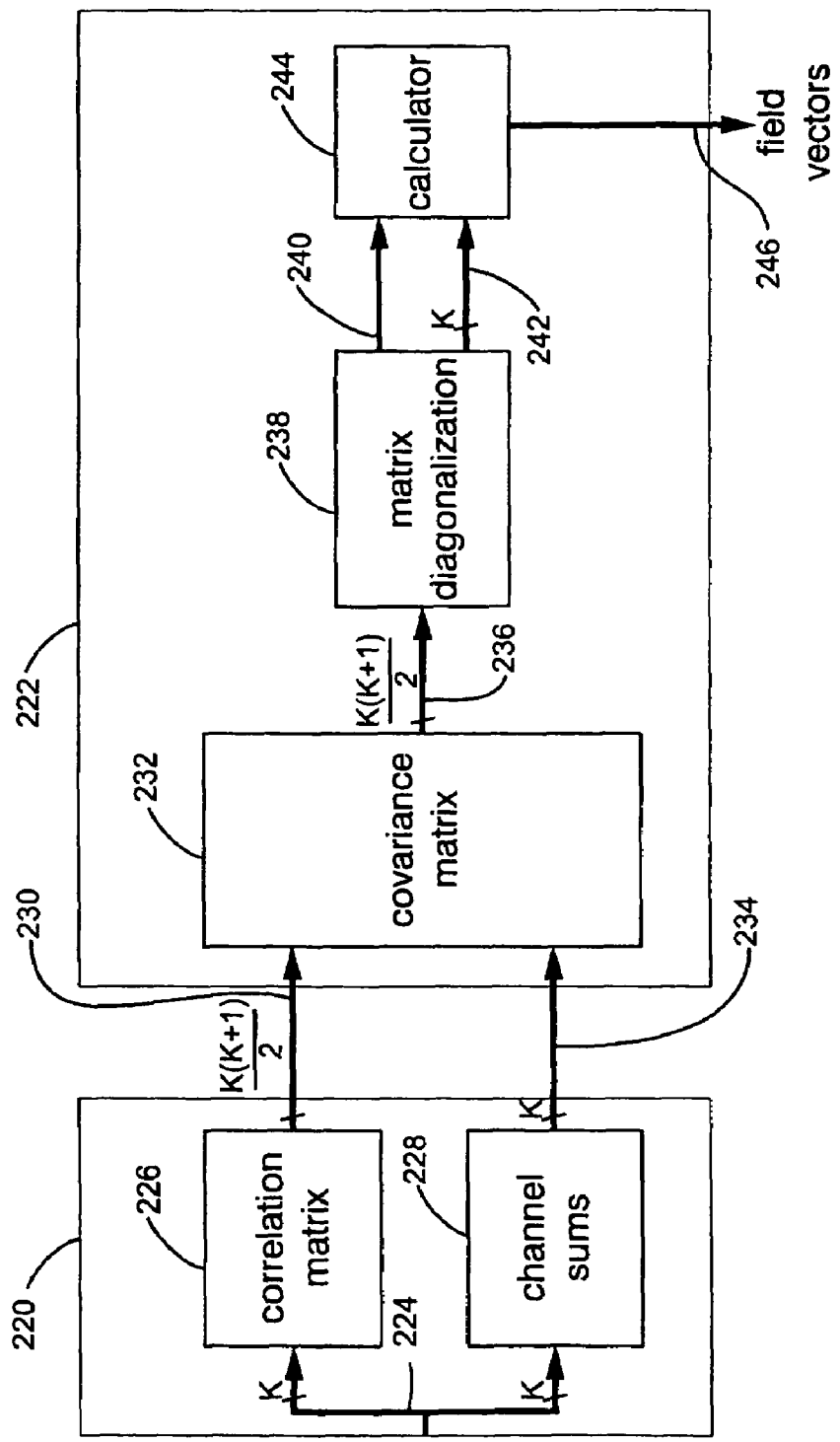
FIG. 14 is a block diagram illustrating an exemplary embodiments of the accumulator and evaluator elements of the amplitude and phase extractor assembly suitable for use with the locator systems of FIGS. 12 and 13.

True line current display 125 indicates a measurement of current that can be either absolute or scaled. The measured current value is calculated in a conventional manner using the 1/R field strength relationship of a cylindrical field where R is determined from the depth calculation (e.g., FIG. 7A). A calibration factor for each frequency of interest can be determined from basic principles based upon antenna sensitivity and preamplifier gain or simply by empirical measurement. If the correlation technique discussed below in connection with FIG. 14 is used over a broad frequency band, then a single frequency centered substantially at mid-band may be used to empirically calibrate the true current measurement value. The display of a current value, either absolute in milliamps or scaled to some basis value may be accomplished by one of many useful methods known in the art. Current measurements are useful for fault finding and also for determining the main path of conduction in a buried utility line that branches. Additional criteria for activating display 125 may include requiring the emission signal strength to be above some predetermined threshold or requiring detected field vector angles to be within some predetermined range. Each time the user crosses over the buried utility line, a new current value is calculated and displayed at display 125. This allows the user to readily appreciate current changes (in a stepwise manner), thereby facilitating a significant improvement in user detection of insulation faults. For example, at the point of a fault where some portion of the current carried by the buried conductor returns to earth ground through an insulation breach, the measured line current may be seen to suddenly drop just beyond the insulation fault location.

Figure 10:
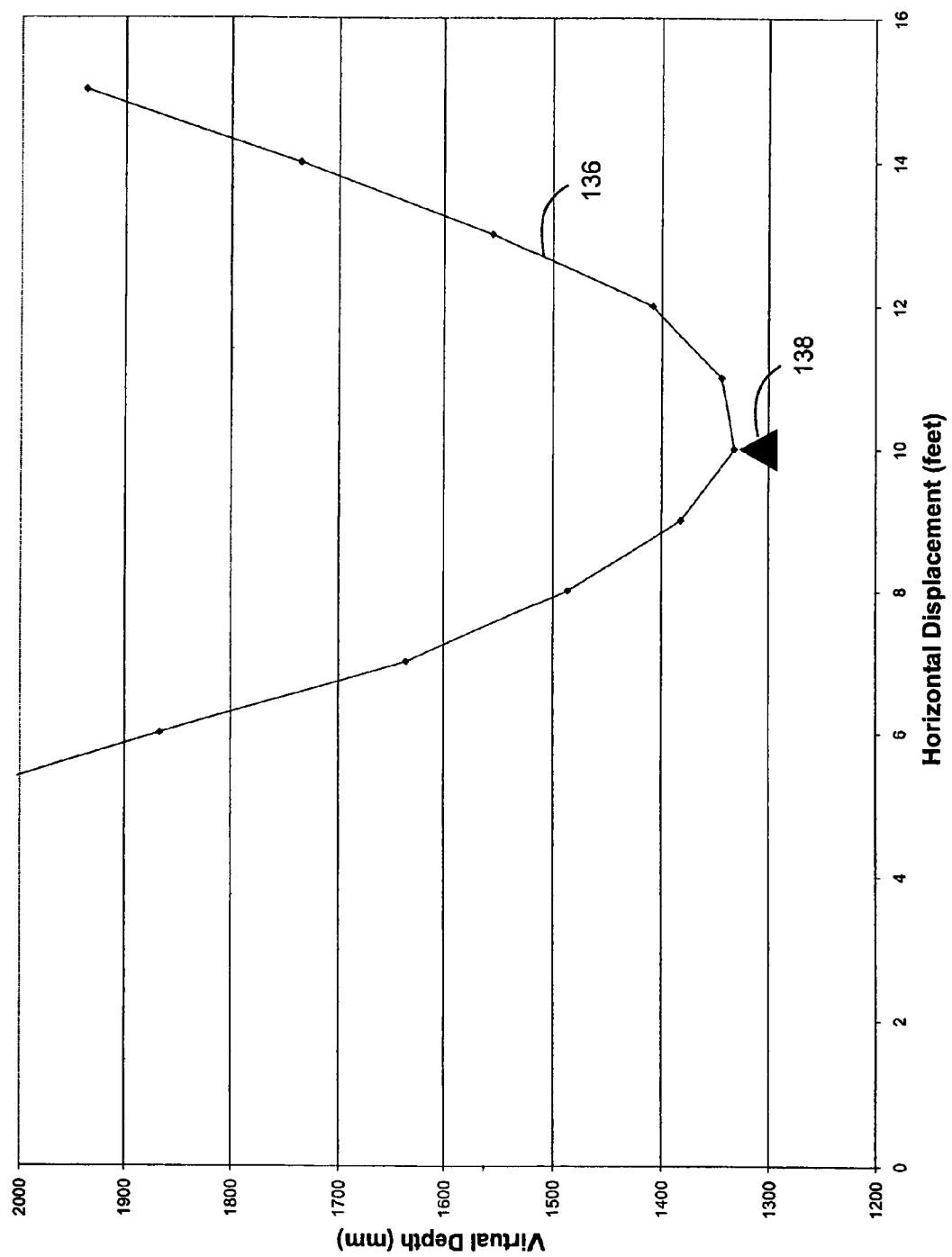
FIG. 10 is a graphical diagram illustrating the single virtual depth signal measured while using an exemplary embodiment of this invention adapted to process virtual depth events in a single frequency band.

FIG. 10 is a graphical diagram illustrating a virtual depth signal 136 measured with an exemplary embodiment of this invention adapted to process virtual depth events in a single frequency band above 15 kHz. Virtual depth signal 136 was measured while moving locator system 20 laterally across a sewer line buried under a concrete slab through which is disposed a test wire energized with a 32,768 Hz voltage. The extremum event 138 was detected about ten feet from the beginning of the transit.

Figure 11:
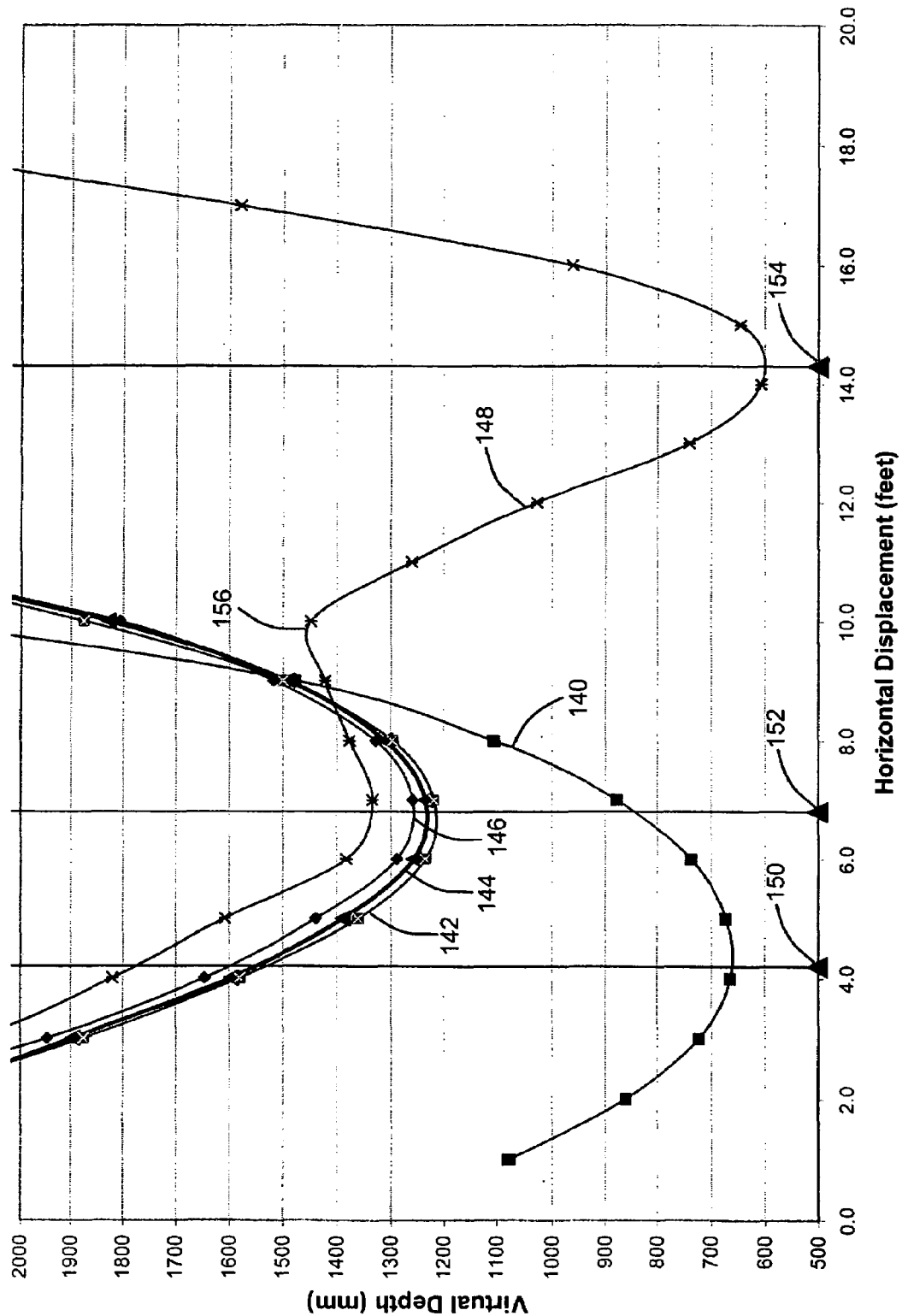
FIG. 11 is a graphical diagram illustrating the several virtual depth signals measured while using an exemplary embodiment of this invention adapted to process virtual depth events in each of several frequency bands.

FIG. 11 is a graphical diagram illustrating the several virtual depth signals measured while using an exemplary embodiment of this invention adapted to process virtual depth events simultaneously in several frequency bands. The line 140 represents a virtual depth signal detected in a passband centered at 8,192 Hz. The line 142 represents a virtual depth signal detected in a 4-15 kHz passband. The line 144 represents a virtual depth signal detected in a passband below 4 kHz. The line 146 represents virtual depth signal detected in a passband centered at 60 Hz. The line 148 represents a virtual depth signal detected in a passband above 15 kHz. According to the method of this invention, a number of extrema are detected in the several virtual depth signals in FIG. 11, each representing an event detection. For example, the event 150 is detected at a minimum in the 8,192 Hz passband virtual depth signal line 140, which is known to be emitted by a gas line energized with an 8,192 Hz transmitter. A few feet further along the transect (some time later), the event 152 is detected at the simultaneous virtual depth signal minima in the other four bands, which indicates the presence of a buried power cable emitting several harmonics of 60 Hz. Finally, at about 14 feet from the beginning of the transect (some time later), a minimum in virtual depth line 148 in the >15 kHz passband signals an event detection 154, indicating a telephone power conduit energized with a 32,768 Hz voltage. Virtual depth signal line 148 had an earlier minima at event 152 because of some cross-coupling of the 32,768 Hz voltage onto the power line, and this same coupling effect also creates a "ghost" extremum 156 which does NOT indicate an event detection (note the reversed inflection value of extremum 156, which may be easily rejected by the event detector). This automated detection of "events" and the determination of "virtual depth" from magnetic field vector and gradient measurements may be better appreciated with reference to the following discussion of FIGS. 12-14.

Figure 12:
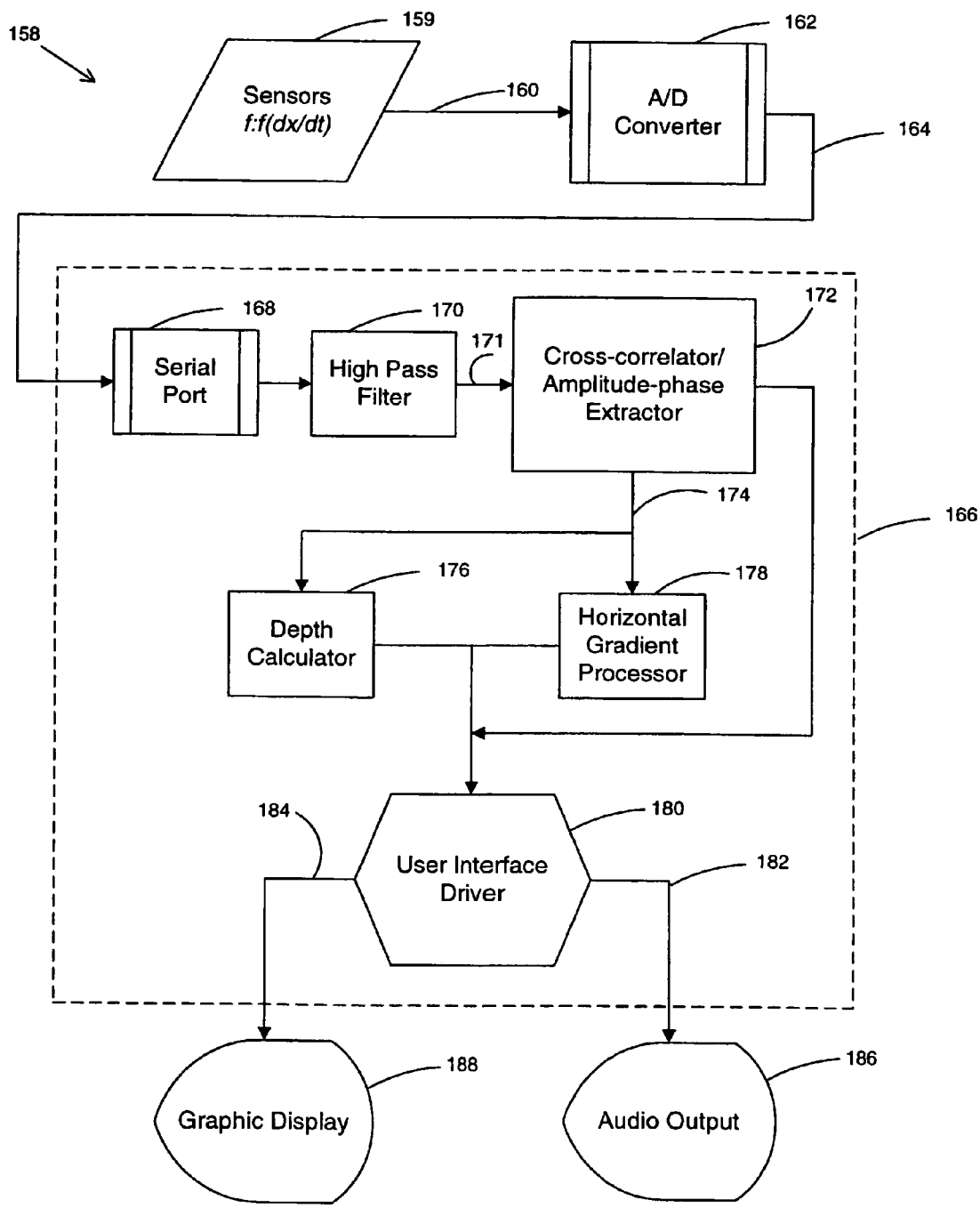
FIG. 12 is a block diagram illustrating an exemplary embodiment of the locator system of this invention including a horizontal gradiometer.

FIG. 12 is a block diagram illustrating an exemplary embodiment 158 of the locator system of this invention. Locator system 158 includes a sensor assembly 159 with the associated signal conditioning elements (not shown) to provide a plurality K of time-varying analog sensor signals $\{S_k(t)\}$ at the signal bus 160. The analog-to-digital (A/D) converter 162 converts signals 160 into digital data 164 representing the sensor signals $\{S_k(t)\}$, which are transferred into the processor 166 through the serial port 168. In processor 166, the digital sensor signals $\{S_k(t)\}$ are filtered to remove the zero and low frequency components in the digital filter 170 before being transferred as the filtered digital sensor signals $\{S_k(t)\}$ 171 to the cross-correlator 172 for extraction of the magnetic field vector and gradient signals in the manner discussed below in connection with FIG. 14, for example. Digital filter 170 may be embodied as a single channel or as a plurality of any combination of low-pass, high-pass or bandpass filter channels. The magnetic vector and gradient signals 174 are next passed to a virtual depth calculator 176 and a horizontal field asymmetry processor 178 for computation of the horizontal field asymmetry component $G_{xx}$ and the various magnetic field vectors B(x, y, z) discussed above in connection with FIGS. 5-7. These resulting signals are finally passed to the UI driver 180 for the generation of the appropriate audio signals 182 and video signals 184, which are respectively passed from processor 166 to the audio UI device 186 and the GUI display 188.

Figure 13:
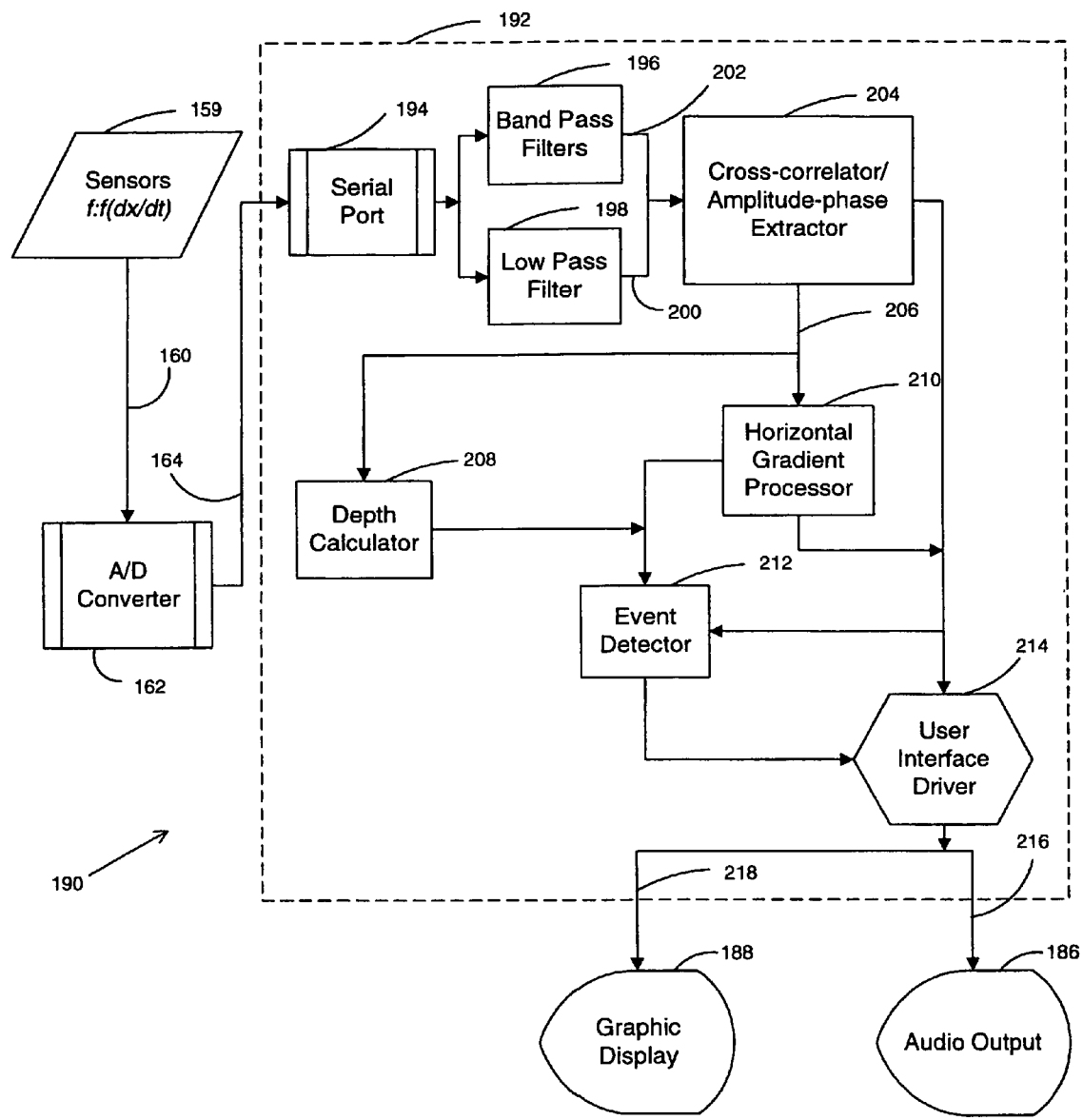
FIG. 13 is a block diagram illustrating an exemplary embodiment of the locator system of this invention including an event detector.

FIG. 13 is a block diagram illustrating an exemplary embodiment 190 of the locator system of this invention. Locator system 190 may also include, for example, sensor assembly 159 with the associated signal conditioning elements (not shown) to provide a plurality K of time-varying analog sensor signals $\{S_k(t)\}$ at signal bus 160. A/D converter 162 converts signals 160 into digital data 164 representing the sensor signals $\{S_k(t)\}$, which are transferred into the processor 192 through the serial port 194. In processor 192, the digital sensor signals $\{S_k(t)\}$ are passed through a plurality of band-pass filters exemplified by the filters 196 and the low-pass filter 198, which segregates the zero and low frequency components 200 into a separate filter channel for use in detecting ferromagnetic fields modulated by user motion. The plurality of passband signals 202 and the user-motion modulation signal 200 are next transferred to the cross-correlator 204 for the multiplexed extraction of magnetic field vector and gradient signals from the digital sensor signals $\{S_k(t)\}$ for each filter channel in the manner discussed below in connection with FIG. 14, for example. The magnetic vector and gradient signals 206 are next passed to a virtual depth calculator 208 and a horizontal field asymmetry processor 210 for computation of the horizontal field asymmetry component $G_{xx}$ and the various magnetic field vectors B(x, y, z) discussed above in connection with FIGS. 5-7. These resulting signals are next passed to the event detector 212 for detection of virtual depth extrema in the manner discussed above in connection with FIGS. 10-11 by any useful means known in the art without limitation. For example, event detector 212 may be embodied as a simple logical peak detector with logic for discarding maxima and retaining minima. Alternatively, event detector 212 may be embodied as a digital differentiator and logical zero-crossing detector combination, with logic for discarding negative-going zero-crossings and retaining positive-going zero-crossings, for example. Finally, the event detections and the various magnetic vector and gradient signals are passed to the UI driver 214 for the generation of the appropriate audio signals 216 and video signals 218, which are respectively passed from processor 192 to audio UI device 186 and GUI display 188, for example.

FIG. 14 is a block diagram illustrating exemplary embodiments of a matrix accumulator 220 and a vector evaluator 222 that may be embodied in cross-correlator 172 (FIG. 12) or in cross-correlator 204 (FIG. 13) to implement a Principle Components Analysis (PCA) technique that is described in detail in the above-cited commonly-assigned patent application Ser. No. 11/054,776 filed on Feb. 9, 2005, which is fully incorporated herein.

PCA is a method of multi-variate statistics that exploits the eigenvalues and eigenvectors of the correlation and/or covariance matrices of a sample data set to extract meaning. Also known in the mathematical arts as the Karhunen-Loève transformation, PCA separates the sample data into components that are uncorrelated with one another. For example, classical PCA seeks orthogonal directions of greatest variability by studying projections of the sample data onto direction vectors starting at the sample mean. The variance of these projections is maximized in the direction of the first eigenvector (i.e. the one with the largest corresponding eigenvalue) of, for example, the sample covariance matrix.

Referring to FIG. 14, for each of a plurality T of τ-second sampling intervals (t=1, T) in a single accumulation interval, accumulator 220 accepts a plurality K of digital signals 224 representing the $t^{th}$ sample of the plurality K of time-varying sensor signals $\{S_k(t)\}$ 171 from filter 170 (FIG. 12), for example.

Correlation matrix accumulator 226 adds the signal sample products $S_iS_j$ for each new plurality K of samples of signals 224 to the existing elements of a symmetric correlation matrix $C_t$ whose elements represent the first expected values of the signal products $E[S_iS_j]$ over the early portion of the accumulation interval at t according to Eqn. 1:

$$C_t = \begin{pmatrix} \overline{S_1S_1} & \cdots & \overline{S_1S_K} \\ \vdots & \ddots & \vdots \\ \overline{S_KS_1} & \cdots & \overline{S_KS_K} \end{pmatrix}.$$ [Eqn. 1]

where E[ ] denotes "first expected value" and the bar notation generally denotes a weighted time average, so $$\bar{x} = \frac{1}{T}\sum_{t=1}^{T}(1-k_t)x_t$$

and, for this embodiment, $k_t=0$ for all t=[1, T].

In the electronics arts, $C_t$ in Eqn. 1 is often called and is herein denominated a "correlation" matrix but this usage is imprecise in the mathematical arts because $C_t$ does not contain the usual statistical correlations $E[(S_i-\mu_i)(S_j-\mu_j)]/(\sigma_i\sigma_j)$ between the time-varying sensor signals $\{S_k(t)\}$ but rather merely the expected values of the products $E[S_iS_j]$ between the signals $\{S_k(t)\}$. As is well-known, cross-correlation is generally defined as the convolution of two complex functions of real time, which for continuous time may be written $$Cor(X, Y)(\tau) = \int_{-\infty}^{\infty} X^*(t)Y(t+\tau)dt$$

where the asterisk denotes complex conjugate. For this exemplary embodiment, the inventors advantageously recognized that, for the purposes of this invention, the difference in delay of the response of individual field sensing channels to a field source is essentially zero, so it is sufficient to evaluate the correlation integral Cor(X, Y)(τ) for τ=0, which is equivalent to a summation of the signal products $S_iS_j$ over some finite time interval, such as the elements of symmetric correlation matrix $C_T$ as defined in Eqn. 1 (at t=T). This expression may be more precisely denominated the matrix of the auto- and cross-correlations of the K time-varying sensor signals $\{S_k(t)\}$. It may be readily appreciated by skilled practitioners that the claimed method and system of this invention are not limited to cross-correlations at τ=0, although the exemplary embodiments described herein generally exploit the advantages of this limiting assumption. The sensor signal auto- and cross-correlations are not so limited nor are their applications in accordance with the method of this invention, which includes all embodiments of the cross-correlation element for non-zero values of t that are consistent with the claims.

Similarly, for each new sample, channel sum accumulator 228 adds the current sample of each signal $S_i$ to the existing elements of a channel sum vector $\mu_t$ whose elements represent the first expected values of the signals $E[S_i]$, according to Eqn. 2:

$$\mu_t = [\overline{S_1}, \overline{S_2} \ldots \overline{S_K}].$$ [Eqn. 2]

At the end of the accumulation interval, where t=T, correlation matrix accumulator 226 transfers the digital signals 230 representing the K(K+1)/2 unique elements of the symmetric cross-correlation matrix $C_T$ to the covariance matrix processor 232 in vector evaluator 222. Channel sum accumulator 228 similarly transfers the digital signals 234 representing the K unique elements of the channel sum vector $\mu_T$ to covariance matrix processor 232, which produces data signals representing the covariance matrix $A_T$ that may be more precisely denominated the matrix of the variances and covariances of the K sensor signals $\{S_k(t)\}$ over the accumulation interval T. According to the well-known equivalence for the covariance of two random variables, $$Cov(X,Y)=E\{[X-E(X)][Y-E(Y)]\}=E\{XY\}-E\{X\}E\{Y\},$$ [Eqn. 3]

so at t=T, covariance matrix $A_T$ may be derived from the symmetric correlation matrix $C_T$ and the channel sum vector $\mu_T$ according to Eqns. 4 and 5:

$$A_T = \begin{pmatrix} (\overline{S_1S_1}-\overline{S_1}\Box\overline{S_1}) & \cdots & (\overline{S_1S_K}-\overline{S_1}\Box\overline{S_K}) \\ \vdots & \ddots & \vdots \\ (\overline{S_KS_1}-\overline{S_K}\Box\overline{S_1}) & \cdots & (\overline{S_KS_K}-\overline{S_K}\Box\overline{S_K}) \end{pmatrix}$$ [Eqn. 4]

$$A_T = \begin{pmatrix} (C_{11}-\mu_1\mu_1) & \cdots & (C_{1K}-\mu_1\mu_K) \\ \vdots & \ddots & \vdots \\ (C_{K1}-\mu_K\mu_1) & \cdots & (C_{KK}-\mu_K\mu_K) \end{pmatrix}$$ [Eqn. 5]

where $C_{ij}$ are the elements of $C_T$ from Eqn. 1 and $\mu_n$ are the elements of $\mu_T$ from Eqn. 2 for t=T. Note that this process of obtaining the covariance matrix $A_T$ results in "de-meaning" of the sensor signals and covariance matrix $A_T$ is therefore useful whether or not the acquisition and processing of the time-varying sensor signals $\{S_k(t)\}$ artificially introduces non-zero means. As used herein, the term "covariance matrix $A_T$" denominates the matrix of the variances and covariances of a plurality K of any time-varying sensor signals $\{S_k(t)\}$ from Eqn. 4 over the interval t=[1, T], and the term "correlation matrix $C_T$" denominates the matrix of the auto-correlations and cross-correlations of a plurality K of any zero-mean time-varying sensor signals $\{S_k(t)\}$ from Eqn. 1 over the interval t=[1, T]. The correlation matrix $C_T$ may also be used to accomplish the method of this invention if a high-pass filter is first used to "de-mean" the sensor signals, as may be appreciated with reference to Eqns. 1-5.

Although this description of matrix accumulator 220 and vector evaluator 222 includes exemplary embodiments that use the matrix of sensor signal variances and covariances $A_T$, the system and method of this invention may also be embodied in a manner that employs a symmetric correlation matrix $C_T$ of K zero-mean time-varying sensor signals $\{S_k(t)\}$, for example. Moreover, should the zero-mean sensor signals $\{S_k(t)\}$ be distorted by the measurement process such that the signal means deviate from zero, the distortion may be removed by de-meaning the distorted signals by means of, for example, a high-pass pre-filter (such as filter 170 in FIG. 12). This is disadvantageous for the blind signal detection application of this invention but, when the target signals are well-known, a bandpass or comb pre-filter stage of some type may be advantageously added to the exemplary embodiments discussed herein. For example, when seeking a known signal emission from sonde or a line illuminator, a high-pass pre-filter may be added as de-meaning operator on finite length sensor data. Similarly, when seeking a buried permanent magnet (emitting a fixed field) in the presence of power-line interference, a low-pass pre-filter (such as filter 198 in FIG. 13) may be added to preserve the resulting non-zero mean sensor signals. However, when an unknown signal is blindly sought, these exemplary embodiments are particularly advantageous for most buried object signal emissions because the sensor signals $\{S_k(t)\}$ need not be presumed zero-mean. Because the sensor signals $\{S_k(t)\}$ usually, but not always, are essentially zero-mean, the covariance matrix $A_T$ (Eqn. 5) implementation, which represents the first non-vanishing statistical moment for zero-mean signals (the second statistical moment) is unexpectedly advantageous.

Recall that covariance matrix $A_T$ represents the variance and covariance statistics of the K sensor signals $\{S_k(t)\}$ over an accumulation interval having a plurality T of τ-second sampling intervals. Upon starting a new accumulation interval at index t=1, which may occur during the present accumulation interval or upon its expiration, for example, accumulator 220 begins to accumulate a new cross-correlation matrix $C_T$ for sensor signals received during the next plurality T of τ-second sampling intervals. According to the method of this invention, the integer number T may vary from one sampling interval to the next. Evaluating the covariance matrix $A_T$ at the end of a predetermined but variable accumulation interval assumes at least a piece-wise stationarity in the sensor signal statistics (stationarity denominates a random process having unchanging statistical properties), but the resulting eigenvalues and eigenvectors need not be either linear or stationary to be useful for detecting the strongest signal component correlated among the sensor plurality without foreknowledge of any signal properties such as precise frequency, modulation or location.

Covariance matrix processor 232 transfers the digital signals 236 representing the K(K+1)/2 unique elements of covariance matrix $A_T$ to the matrix eigenvalue processor 238, which produces the K eigenvalues $\{\lambda_k\}$ and associated eigenvectors $\{V_k\}$ for covariance matrix $A_T$ in any one of the useful fashions known in the mathematical arts.

By way of example, a singular value decomposition (SVD) method for producing these eigenvalues and eigenvectors is now described. Expressing the diagonal matrix as the square of another diagonal matrix has the advantage of making the largest value in Σ directly equivalent to the magnitude of the eigenvector. As used herein, the eigenvalue $\lambda_1$ is proportional to the power of the corresponding electromagnetic signal emission and the square root of the eigenvalue $\lambda_1$ is proportional to the amplitude of the corresponding electromagnetic signal emission at the sensor assembly.

As is well-known in the mathematical arts, the SVD represents an expansion of the original sensor signal data in a coordinate system where the symmetric covariance matrix A is also diagonal. Calculating the SVD for any M×N matrix A (M≧N) consists of finding two orthogonal matrices U and V such that $$A = U\Sigma V^T \qquad [\text{Eqn. 6}]$$

where U is an M×M orthogonal matrix, V is a N×N orthogonal matrix and Σ is an M×N "diagonal" matrix containing the N "singular values" for A ordered from the largest to the smallest value. Because U and V are orthogonal, then of course $UU^T=VV^T=I$, the unit matrix of appropriate rank. As is well known in the mathematical arts, both a cross-correlation matrix C and a covariance matrix A are square, symmetric, and positive semi-definite, and in such a case, U=V. For M=N, when A is a square symmetric matrix, SVD is equivalent to diagonalization, which is simply the solution of the eigenvalue problem, where $\Sigma^T\Sigma=\Lambda$ is a diagonal matrix with entries representing the eigenvalues $\{\lambda_k\}$ of A and the columns of V are the corresponding eigenvectors $V_k$. This may be appreciated from the following relationships:

$$A^T A = V\Sigma^T U^T U\Sigma V^T = V\Sigma^T \Sigma V^T = V\Lambda V^T \qquad [\text{Eqn. 7}]$$

The actual implementation of this SVD technique need not use the general SVD approach described above but may instead, for example, use any of the well-known methods exemplified by the SVD methods disclosed at http://www.library.cornell.edu/nr/bookcpdf/c11-2.pdf and http://www.library.cornell.edu/nr/bookcpdf/c11-3.pdf, which may be written in efficient assembly code for the TMS320VC5502 digital signal processor, for example. Reference is also made to, for example, Press et al. [Press et al., "Numerical Recipes in C: The Art of Scientific Computing (Chapter 11)," Cambridge University Press, 2nd edition, Oct. 30, 1992, ISBN: 0521431085] for useful numerical methods implementing the SVD technique.

In FIG. 14, matrix eigenvalue processor 238 produces a digital signal 240 representing the largest eigenvalue $\lambda_1$ and the digital signals 242 representing the plurality K elements of the corresponding eigenvector $V_1$, which are located at the k=1 positions respectively in Λ and V because of reordering by scalar value during the SVD. Digital signals 240 and 242 are accepted by the field vector calculator 244 in vector evaluator 222 and used to produce the digital data 246 representing one or more field vectors for processing and display by, for example, GUI display 166 in FIG. 7 or GUI display 124 in FIG. 5.

The PCA method of this invention is particularly useful as a blind signal detection method because matrix accumulator 220 and vector evaluator 222 produce a field vector for at least one electromagnetic signal emission during each accumulation interval, without foreknowledge of the properties of such signal emission. However, the PCA method of this invention is also useful for locating known signals emitted by buried objects, including sondes and the like. Matrix accumulator 220 always produces a maximal eigenvalue and associated eigenvector, which may be processed to produce a field vector for the strongest signal emission in the vicinity, whatever it is. It is an important feature and advantage of the system and method of this invention that, within each of a plurality of band-pass filter frequency regions, the strongest coherent signal emission in the vicinity, whether active or passive, may always be blindly detected and located.

Clearly, other embodiments and modifications of this invention may occur readily to those of ordinary skill in the art in view of these teachings. Therefore, this invention is to be limited only by the following claims, which include all such embodiments and modifications when viewed in conjunction with the above specification and accompanying drawing.

The invention claimed is:

1. A human-portable utility locator system for locating a buried utility line characterized by an electromagnetic field emission, the system comprising:
   two sensor arrays each for detecting the electromagnetic field emission;
   a processor coupled to the two sensor arrays for determining a B-field vector magnitude at each sensor array as a function of time within one or more frequency bands;
   a proximity detector coupled to the processor for producing a virtual depth signal representing the virtual depth of the electromagnetic field emission corresponding to the B-field vectors; and
   a user interface coupled to the proximity detector for generating an acoustic signal for transmission to a user, wherein the acoustic signal includes a frequency that varies inversely to any variation of the virtual depth signal.

2. The system of claim 1 further comprising:
   in the processor, means for determining the B-field gradient between the two sensor arrays corresponding to the B-field vectors as a function of time within each of the one or more frequency bands.

3. The system of claim 2 further comprising:
   an event detector coupled to the processor for detecting an event corresponding to an extremum in the B-field gradient with respect to time.

4. The system of claim 3 further comprising:
   in the proximity detector, means for producing a virtual depth signal representing the virtual depth of the electromagnetic field emission corresponding to the B-field gradient in each of a plurality of frequency bands; and
   in the user interface, a display for reporting to a user a detection depth representing the minimum virtual depth signal from among the plurality of frequency bands.

5. The system of claim 4 further comprising:
   in each sensor array, a plurality K of sensors each having a sensor axis and producing a time-varying sensor signal $S_k(t)$ representing the electromagnetic field emission, wherein $1 \leq k \leq K$; and
   in the processor, means for processing a plurality K of the time-varying sensor signals $\{S_k(t)\}$, including
   a matrix accumulator for producing a data signal representing a K by K covariance matrix $A_T$ corresponding to the covariances of the time-varying sensor signals $\{S_k(t)\}$ over a selected time interval, wherein covariance matrix $A_T$ is characterized by a plurality K of eigenvalues $\{\lambda_k\}$ and associated eigenvectors $\{V_k\}$ and
   calculating means for producing a data signal representing a B-field vector at the sensor assembly, wherein the B-field vector corresponds to the eigenvector $V_1$ associated with the largest $\lambda_1$ of the eigenvalues $\{\lambda_k\}$.

6. The system of claim 3 further comprising:
   in the event detector, a comparator for detecting an event corresponding to substantially coincident B-field gradient extrema within two or more frequency bands.

7. The system of claim 6 further comprising:
   in each sensor array, a plurality K of sensors each having a sensor axis and producing a time-varying sensor signal $S_k(t)$ representing the electromagnetic field emission, wherein $1 \leq k \leq K$; and
   in the processor, means for processing a plurality K of the time-varying sensor signals $\{S_k(t)\}$, including
   a matrix accumulator for producing a data signal representing a K by K covariance matrix $A_T$ corresponding to the covariances of the time-varying sensor signals $\{S_k(t)\}$ over a selected time interval, wherein covariance matrix $A_T$ is characterized by a plurality K of eigenvalues $\{\lambda_k\}$ and associated eigenvectors $\{V_k\}$ and
   calculating means for producing a data signal representing a B-field vector at the sensor assembly, wherein the B-field vector corresponds to the eigenvector $V_1$ associated with the largest $\lambda_1$ of the eigenvalues $\{\lambda_k\}$.

8. The system of claim 1 further comprising:
   in each sensor array, a plurality K of sensors each having a sensor axis and producing a time-varying sensor signal $S_k(t)$ representing the electromagnetic field emission, wherein $1 \leq k \leq K$; and
   in the processor, means for processing a plurality K of the time-varying sensor signals $\{S_k(t)\}$, including
   a matrix accumulator for producing a data signal representing a K by K covariance matrix $A_T$ corresponding to the covariances of the time-varying sensor signals $\{S_k(t)\}$ over a selected time interval, wherein covariance matrix $A_T$ is characterized by a plurality K of eigenvalues $\{\lambda_k\}$ and associated eigenvectors $\{V_k\}$ and
   calculating means for producing a data signal representing a B-field vector at the sensor assembly, wherein the B-field vector corresponds to the eigenvector $V_1$ associated with the largest $\lambda_1$ of the eigenvalues $\{\lambda_k\}$.

9. A human-portable locator system for locating a buried object characterized by a self-induced magnetic field, the system comprising:
   two sensor arrays each for detecting variations in the self-induced magnetic field arising from locator system motion;
   a processor coupled to the two sensor arrays for determining a B-field vector magnitude at each sensor array as a function of time within one or more frequency bands;

a proximity detector coupled to the processor for producing a virtual depth signal representing the virtual depth of the electromagnetic field emission corresponding to the B-field vectors; and a user interface coupled to the proximity detector for generating an acoustic signal for transmission to a user, wherein the acoustic signal includes a frequency that varies inversely to any variation of the virtual depth signal.

10. The system of claim 9 further comprising:

in the processor, means for determining the B-field gradient between the two sensor arrays corresponding to the B-field vectors as a function of time within each of the one or more frequency bands.

11. The system of claim 10 further comprising:

an event detector coupled to the processor for detecting an event corresponding to an extremum in the B-field gradient with respect to time.

12. The system of claim 11 further comprising:

in the event detector, a comparator for detecting an event corresponding to substantially coincident B-field gradient extrema within two or more frequency bands.

13. The system of claim 9 further comprising:

in the proximity detector, means for producing a virtual depth signal representing the virtual depth of the electromagnetic field emission corresponding to the B-field gradient in each of a plurality of frequency bands; and in the user interface, a display for reporting to a user a detection depth representing the minimum virtual depth signal from among the plurality of frequency bands.

14. The system of claim 9 further comprising:

in each sensor array, a plurality K of sensors each having a sensor axis and producing a time-varying sensor signal $S_k(t)$ representing the electromagnetic field emission, wherein $1 \leq k \leq K$; and in the processor, means for processing a plurality K of the time-varying sensor signals $\{S_k(t)\}$, including a matrix accumulator for producing a data signal representing a K by K covariance matrix $A_T$ corresponding to the covariances of the time-varying sensor signals $\{S_k(t)\}$ over a selected time interval, wherein covariance matrix $A_T$ is characterized by a plurality K of eigenvalues $\{\lambda_k\}$ and associated eigenvectors $\{V_k\}$ and calculating means for producing a data signal representing a B-field vector at the sensor assembly, wherein the B-field vector corresponds to the eigenvector $V_1$ associated with the largest $\lambda_1$ of the eigenvalues $\{\lambda_k\}$.

15. A human-portable utility locator system for locating a buried utility line characterized by an electromagnetic field emission, the system comprising:

two sensor arrays each for detecting the electromagnetic field emission;

a processor coupled to the two sensor arrays for determining the B-field gradient between them as a function of time within at least one frequency band;

an event detector coupled to the processor for detecting an event corresponding to an extremum in the B-field gradient with respect to time; and a user interface coupled to the event detector for signaling the detected event to a user.

16. The system of claim 15 further comprising:

in the event detector, a comparator for detecting an event corresponding to substantially coincident B-field gradient extrema within two frequency bands.

17. The system of claim 16 further comprising:

a proximity detector coupled to the processor for producing a virtual depth signal representing the virtual depth of the electromagnetic field emission corresponding to the B-field gradient in each of a plurality of frequency bands; and in the user interface, a display for reporting to a user a detection depth representing the minimum virtual depth signal from among the plurality of frequency bands.

18. The system of claim 17 further comprising:

in each sensor array, a plurality K of sensors each having a sensor axis and producing a time-varying sensor signal $S_k(t)$ representing the electromagnetic field emission, wherein $1 \leq k \leq K$; and in the processor, means for processing a plurality K of the time-varying sensor signals $\{S_k(t)\}$, including a matrix accumulator for producing a data signal representing a K by K covariance matrix $A_T$ corresponding to the covariances of the time-varying sensor signals $\{S_k(t)\}$ over a selected time interval, wherein covariance matrix $A_T$ is characterized by a plurality K of eigenvalues $\{\lambda_k\}$ and associated eigenvectors $\{V_k\}$ and calculating means for producing a data signal representing a B-field vector at the sensor assembly, wherein the B-field vector corresponds to the eigenvector $V_1$ associated with the largest $\lambda_1$ of the eigenvalues $\{\lambda_k\}$.

19. The system of claim 15 further comprising:

a proximity detector coupled to the processor for producing a virtual depth signal representing the virtual depth of the electromagnetic field emission corresponding to the B-field gradient in at least one frequency band; and in the user interface, a display for reporting to a user a numeric value representing the inverse of the virtual depth for the at least one frequency band.

20. The system of claim 15 further comprising:

in the user interface, an acoustic user interface for producing a detection signal whose audio frequency represents the B-field gradient value.

21. A human-portable locator system for locating a buried object characterized by a self-induced magnetic field, the system comprising:

two sensor arrays each for detecting variations in the self-induced magnetic field arising from locator system motion;

a processor coupled to the two sensor arrays for determining the B-field gradient between them as a function of time within at least one frequency band;

an event detector coupled to the processor for detecting an event corresponding to a B-field gradient extremum;

a user interface coupled to the event detector for signaling an event detection to a user.

22. The system of claim 21 further comprising:

in the event detector, a comparator for detecting an event corresponding to substantially coincident B-field gradient extrema within two frequency bands.

23. The system of claim 21 further comprising:

a proximity detector coupled to the processor for producing a virtual depth signal representing the virtual depth of the electromagnetic field emission corresponding to the B-field gradient in each of a plurality of frequency bands; and in the user interface, a display for reporting to a user a detection depth representing the minimum virtual depth signal from among the plurality of frequency bands.

24. The system of claim 21 further comprising:

in each sensor array, a plurality K of sensors each having a sensor axis and producing a time-varying sensor signal $S_k(t)$ representing the electromagnetic field emission, wherein $1 \leq k \leq K$; and in the processor, means for processing a plurality K of the time-varying sensor signals $\{S_k(t)\}$, including a matrix accumulator for producing a data signal representing a K by K covariance matrix $A_T$ corresponding to the covariances of the time-varying sensor signals $\{S_k(t)\}$ over a selected time interval, wherein covariance matrix $A_T$ is characterized by a plurality K of eigenvalues $\{\lambda_k\}$ and associated eigenvectors $\{V_k\}$ and calculating means for producing a data signal representing a B-field vector at the sensor assembly, wherein the B-field vector corresponds to the eigenvector $V_1$ associated with the largest $\lambda_1$ of the eigenvalues $\{\lambda_k\}$.

25. A human-portable utility locator system for locating a buried utility line characterized by an electromagnetic field emission, the system comprising:

a first pair of spaced-apart electromagnetic sensor arrays disposed on a first axis, each array including a plurality of electromagnetic field sensors, each sensor having a sensing axis disposed substantially orthogonal to the other sensing axes in the array;

a second pair of spaced-apart electromagnetic sensors disposed on a second axis, each sensor having a sensing axis disposed substantially parallel with the second axis; and a supporting structure for fixing the second axis between the first pair of spaced-apart electromagnetic sensor arrays and substantially orthogonal to the first axis.

26. The system of claim 25 further comprising:

a processor coupled to the two sensor arrays for determining a B-field vector magnitude at each sensor array as a function of time within one or more frequency bands;

a proximity detector coupled to the processor for producing a virtual depth signal representing the virtual depth of the electromagnetic field emission corresponding to the B-field vectors; and a user interface coupled to the proximity detector for generating an acoustic signal for transmission to a user, wherein the acoustic signal includes a frequency that varies inversely to any variation of the virtual depth signal.

27. The system of claim 26 further comprising:

in the proximity detector, means for producing a virtual depth signal representing the virtual depth of the electromagnetic field emission corresponding to the B-field gradient in each of a plurality of frequency bands; and in the user interface, a display for reporting to a user a detection depth representing the minimum virtual depth signal from among the plurality of frequency bands.

28. The system of claim 25 further comprising:

a processor coupled to the two sensor arrays for determining the B-field gradient between them as a function of time within at least one frequency band;

an event detector coupled to the processor for detecting an event corresponding to an extremum in the B-field gradient with respect to time; and a user interface coupled to the event detector for signaling the detected event to a user.

29. The system of claim 28 further comprising:

in the event detector, a comparator for detecting an event corresponding to substantially coincident B-field gradient extrema within two frequency band.

* * * * *